United States Patent
Noguchi et al.

(10) Patent No.: US 12,238,930 B2
(45) Date of Patent: Feb. 25, 2025

(54) SEMICONDUCTOR MEMORY DEVICE WITH INCREASED RELIABILITY AND METHOD FOR MANUFACTURING THE SAME

(71) Applicant: Kioxia Corporation, Tokyo (JP)

(72) Inventors: Masaki Noguchi, Yokkaichi Mie (JP); Tatsunori Isogai, Yokkaichi Mie (JP)

(73) Assignee: Kioxia Corporation (JP)

( * ) Notice: Subject to any disclaimer, the term of this patent is extended or adjusted under 35 U.S.C. 154(b) by 604 days.

(21) Appl. No.: 17/465,496

(22) Filed: Sep. 2, 2021

(65) Prior Publication Data
US 2022/0302139 A1    Sep. 22, 2022

(30) Foreign Application Priority Data
Mar. 19, 2021    (JP) ................. 2021-046191

(51) Int. Cl.
*H10B 43/35*    (2023.01)
*H01L 23/528*    (2006.01)
*H10B 43/27*    (2023.01)

(52) U.S. Cl.
CPC ......... *H10B 43/35* (2023.02); *H01L 23/5283* (2013.01); *H10B 43/27* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 6,005,270 A * 12/1999 Noguchi ............. H01L 27/1203
    257/30
7,393,744 B2    7/2008 Joo
    (Continued)

FOREIGN PATENT DOCUMENTS

JP    4977855    7/2012
JP    4983159    7/2012
    (Continued)

*Primary Examiner* — Didarul A Mazumder
*Assistant Examiner* — Gustavo G Ramallo
(74) *Attorney, Agent, or Firm* — FOLEY & LARDNER LLP

(57) ABSTRACT

A semiconductor device includes: a stacked body with insulating layers and conductive layers alternately stacked along a first direction; a semiconductor layer disposed along the first direction in the stacked body; a first insulating film disposed along the first direction between the stacked body and the semiconductor layer; a second insulating film disposed along the first direction between the stacked body and the first insulating layer; a third insulating film disposed along the first direction between the stacked body and the second insulating film; and a fourth insulating film having a first portion and a second portion, the first portion being disposed between the conductive layers and the third insulating film, and the second portion being disposed along a second direction that intersects the first direction between the conductive layer and the insulating layer and being connected to the first portion, and average concentrations of deuterium in the first portion of the fourth insulating film, the third insulating film, the second insulating film, and the first insulating film are lower in an order of the second insulating film>the first insulating film>the first portion>the third insulating film.

15 Claims, 22 Drawing Sheets

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50

See application file for complete search history.

(56) References Cited

U.S. PATENT DOCUMENTS

| | | | |
|---|---|---|---|
| 7,795,158 B2 | 9/2010 | Fujita et al. | |
| 8,222,688 B1 * | 7/2012 | Jenne | G11C 16/04 438/763 |
| 8,253,189 B2 | 8/2012 | Sekine et al. | |
| 10,153,262 B2 | 12/2018 | Isogai et al. | |
| 11,631,694 B2 * | 4/2023 | Noguchi | H01L 21/3115 438/268 |
| 2009/0184401 A1 * | 7/2009 | Matsushita | H10B 41/30 438/479 |
| 2014/0073099 A1 * | 3/2014 | Park | H01L 29/7926 438/268 |
| 2018/0269196 A1 * | 9/2018 | Isogai | H10B 43/30 |
| 2019/0081144 A1 | 3/2019 | Isogai et al. | |
| 2019/0136132 A1 * | 5/2019 | Han | C09K 13/06 |
| 2022/0059356 A1 * | 2/2022 | Han | H01L 29/7926 |

FOREIGN PATENT DOCUMENTS

| | | |
|---|---|---|
| JP | 5443873 | 3/2014 |
| JP | 2018-157035 | 10/2018 |
| JP | 2019-054068 | 4/2019 |

* cited by examiner

SEMICONDUCTOR MEMORY DEVICE WITH INCREASED RELIABILITY AND METHOD FOR MANUFACTURING THE SAME

CROSS-REFERENCE TO RELATED APPLICATION

This application is based upon and claims the benefit of priority from Japanese Patent Application No. 2021-046191, filed Mar. 19, 2021, the entire contents of which are incorporated herein by reference.

FIELD

Embodiments described herein relate to a semiconductor device and a method for manufacturing the same.

BACKGROUND

As a semiconductor memory device, a NAND flash memory with memory cells three-dimensionally arranged is known. In the NAND flash memory, a stacked body with a plurality of electrode layers and insulating layers alternately stacked is provided with a memory hole penetrating through the stacked body. A memory string with a plurality of memory cells connected in series is formed by providing a block insulating film, a charge storage film, a tunnel insulating film, and a semiconductor layer (channel layer) in the memory hole. Data is stored in the memory cells through control of the amount of charge stored in the charge storage film.

In the semiconductor device configured in this manner, there is a problem that defects occur in the charge storage film and the tunnel insulating film due to repeated writing and erasing operations and a part of the charge stored in the charge storage film escapes in a channel direction or an adjacent cell direction via such defects. This leads to degradation of reliability of the memory cells.

DETAILED DESCRIPTION

Embodiments provide a semiconductor device capable of curbing degradation of reliability of a memory cell and a method for manufacturing the same.

The semiconductor device according to an embodiment includes a stacked body with insulating layers and conductive layers alternately stacked along a first direction, a semiconductor layer disposed along the first direction in the stacked body, a first insulating film disposed along the first direction between the stacked body and the semiconductor layer, a second insulating film disposed along the first direction between the stacked body and the first insulating film, a third insulating film disposed along the first direction between the stacked body and the second insulating film, and a fourth insulating film having a first portion and a second portion, the first portion being disposed between the conductive layers and the third insulating film, and the second portion being disposed along a second direction that intersects the first direction between the conductive layers and the insulating layers and being connected to the first portion, in which average concentrations of deuterium in the first portion of the fourth insulating film, the third insulating film, the second insulating film, and the first insulating film are lower in an order of the second insulating film>the first insulating film>the first portion>the third insulating film.

Hereinafter, embodiments of the present disclosure will be described with reference to the drawings. In FIGS. 1 to 20, the same reference signs will be applied to the same configurations, and description will not be repeated.

First Embodiment

Figure 1:
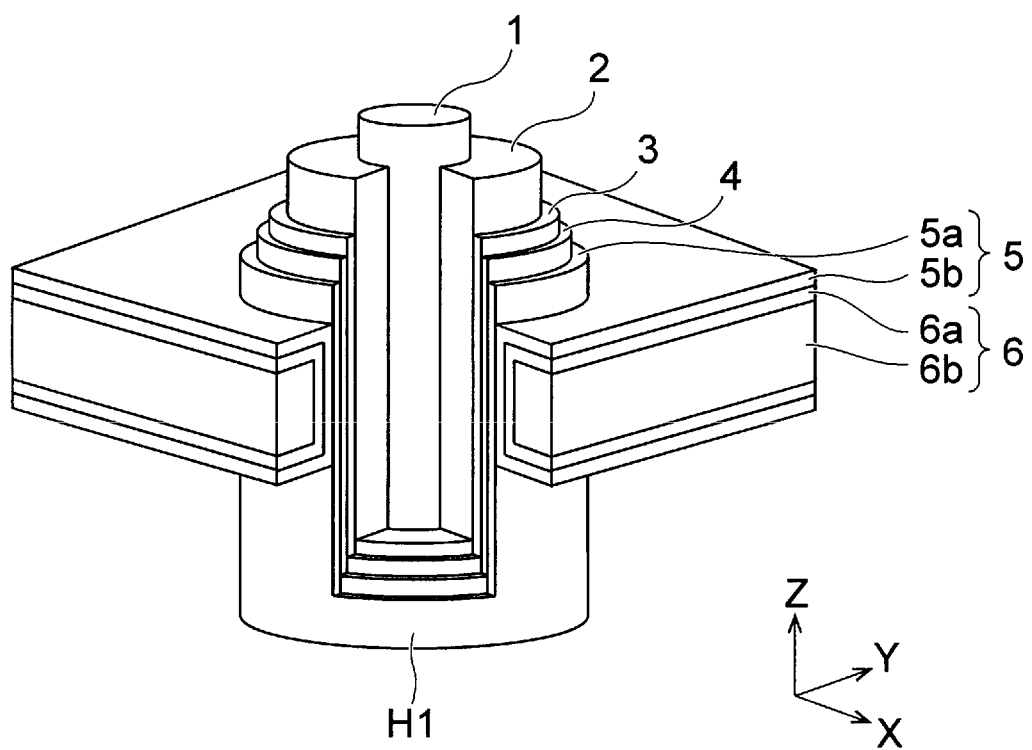
FIG. 1 is a perspective view illustrating a structure of a semiconductor device according to a first embodiment.

FIG. 1 is a perspective view illustrating a structure of a semiconductor device according to a first embodiment. The semiconductor device in FIG. 1 is, for example, a three-dimensional NAND memory.

The semiconductor device in FIG. 1 includes a core insulating film 1, a channel semiconductor layer 2, a tunnel insulating film 3, a charge storage film 4, a block insulating film 5, and an electrode layer 6. The block insulating film 5 includes an insulating film 5a and an insulating film 5b. The electrode layer 6 includes a barrier metal layer 6a and an electrode material layer 6b. The insulating film 5a is an example of the first insulating film, the tunnel insulating film 3 is an example of the second insulating film, and the channel semiconductor layer 2 is an example of the first semiconductor layer. The tunnel insulating film 3, the charge storage film 4, and the block insulating film 5 are also called a cell stacked film.

In the semiconductor device according to at embodiment, a plurality of electrode layers and a plurality of insulating layers are alternately stacked on a substrate, and a memory hole H1 is provided in the electrode layers and the insulating layers. FIG. 1 illustrates one electrode layer 6 out of these electrode layers. These electrode layers function as word lines for a NAND memory, for example. FIG. 1 illustrates an X direction and a Y direction that are parallel to a surface of the substrate and are perpendicular to each other and a Z direction that is perpendicular to the surface of the substrate. In the specification, a +Z direction will be handled as an upper direction, and a −Z direction will be handled as a lower direction. The −Z direction may coincide with a gravity direction or may not coincide with the gravity direction.

The core insulating film 1, the channel semiconductor layer 2, the tunnel insulating film 3, the charge storage film 4, and the insulating film 5a are formed in the memory hole H1 and configure a memory cell in the NAND memory. The insulating film 5a is formed on the surfaces of the electrode layer and the insulating layer in the memory hole H1, and the charge storage film 4 is formed on the surface of the insulating film 5a. The charge storage film 4 can store charge between an outer side surface and an inner side surface thereof. The tunnel insulating film 3 is formed on the surface of the charge storage film 4, and the channel semiconductor layer 2 is formed on the surface of the tunnel insulating film 3. The channel semiconductor layer 2 functions as a channel for the memory cell. The core insulating film 1 is formed in the channel semiconductor layer 2.

The insulating film 5a is, for example, a SiO film (silicon oxide film). The charge storage film 4 is, for example, a SiN film (silicon nitride film). The tunnel insulating film 3 is, for example, a SiON film (silicon oxynitride film). The channel semiconductor layer 2 is, for example, a polysilicon layer. The core insulating film 1 is, for example, a silicon oxide film.

The insulating film 5b, the barrier metal layer 6a, and the electrode material layer 6b are formed between mutually adjacent insulating layers and are formed in order on the lower surface of the upper insulating layer, the upper surface of the lower insulating layer, and the side surface of the insulating film 5a. The insulating film 5b is, for example, a metal insulating film of aluminum oxide or the like. The barrier metal layer 6a is, for example, a titanium nitride film. The electrode material layer 6b is, for example, a tungsten (W) layer.

FIGS. 2 to 5 and FIG. 8 are sectional views illustrating a method for manufacturing the semiconductor device according to the first embodiment.

Figure 2:
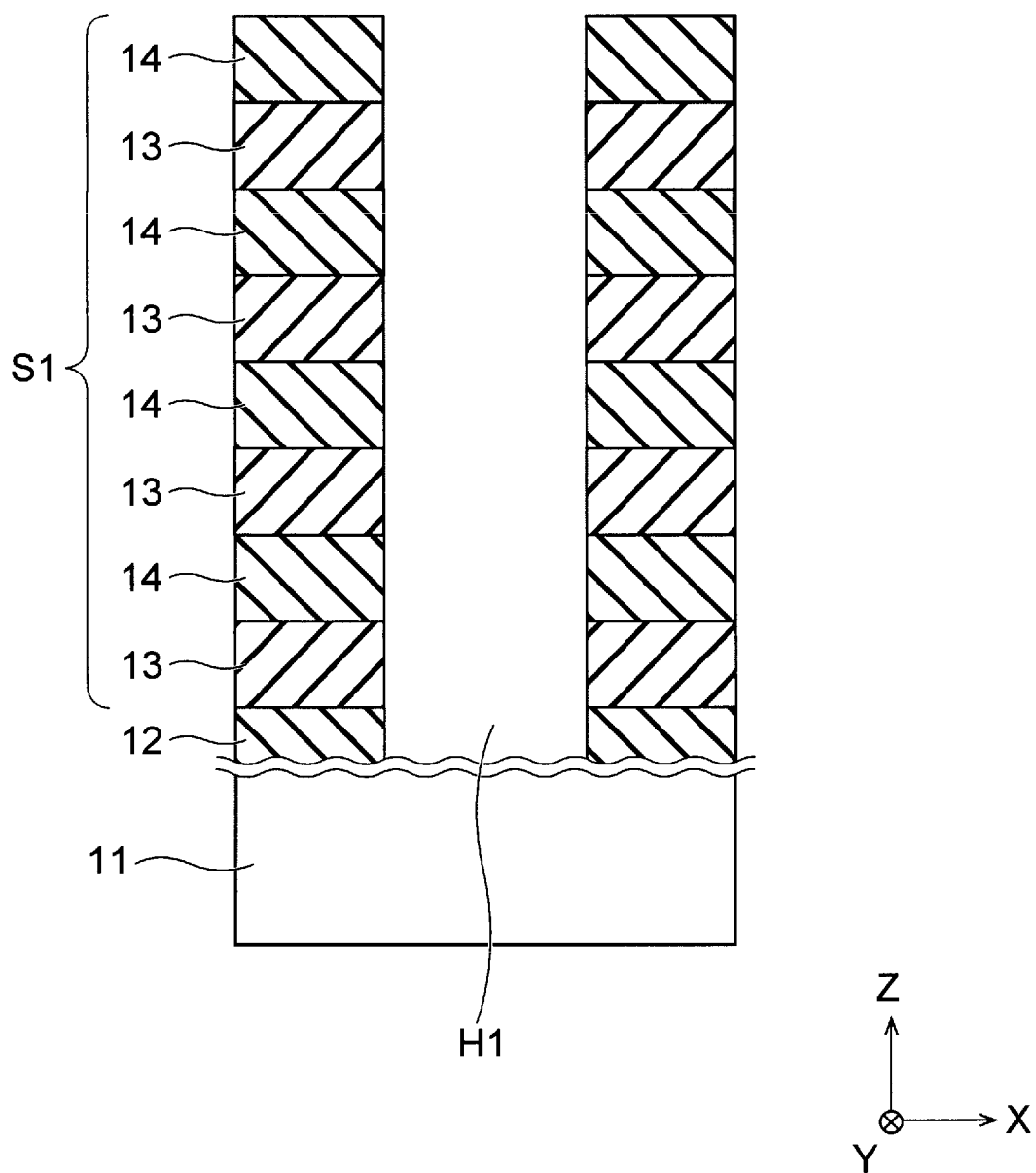
FIG. 2 is a sectional view illustrating a method for manufacturing the semiconductor device according to the first embodiment.

First, an insulating film 12 is formed above a substrate 11, and a plurality of sacrifice layers 13 and a plurality of insulating layers 14 are alternately formed on the insulating film 12 (FIG. 2). As a result, a stacked film S1 including the plurality of sacrifice layers 13 and the plurality of insulating layers 14 alternately stacked is formed on the insulating film 12. The substrate 11 is, for example, a semiconductor substrate such as a silicon substrate. The insulating film 12 is, for example, a silicon oxide film (SiO). The sacrifice layers 13 are, for example, silicon nitride films (SiN), and the insulating layers 14 are, for example, silicon oxide films (SiO).

Next, a memory hole H1 penetrating through the stacked film S1 and the insulating film 12 is formed (FIG. 2). As a result, the upper surface of the layer provided between the substrate 11 and the insulating film 12 is exposed to the inside of the memory hole H1. Details of the layer will be described later.

Figure 3:
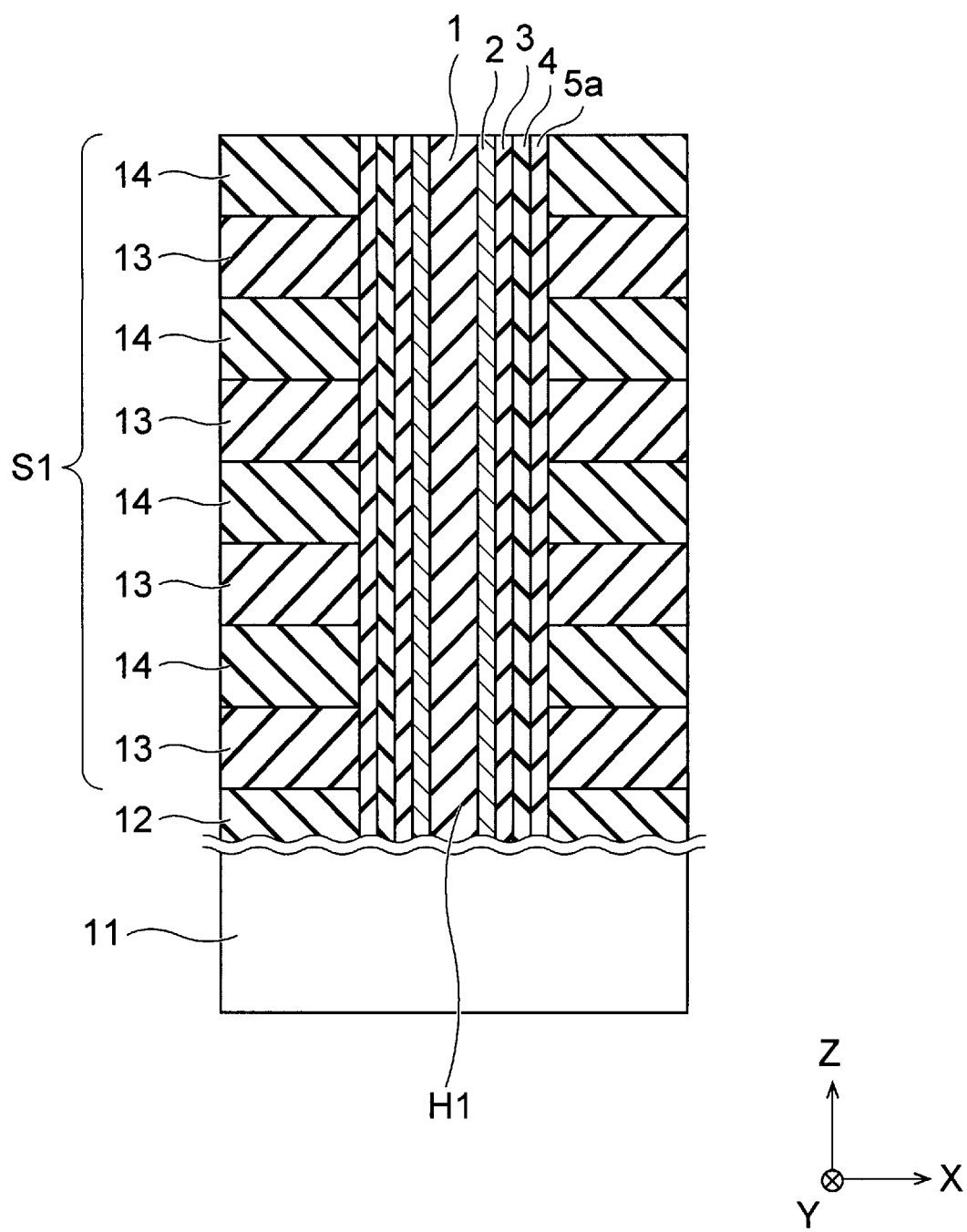
FIG. 3 is a sectional view illustrating the method for manufacturing the semiconductor device according to the first embodiment.

Next, the insulating film 5a, the charge storage film 4, the tunnel insulating film 3, and a portion of the channel semiconductor layer 2 are formed in order in the memory hole H1 (FIG. 3). Then, the insulating film 5a, the charge storage film 4, the tunnel insulating film 3, and the portion of the channel semiconductor layer 2 are removed from the bottom portion of the memory hole H1 through etching, and a remaining portion of the channel semiconductor layer 2 and the core insulating film 1 are then formed in order in the memory hole H1 (FIG. 3). As a result, the insulating film 5a, the charge storage film 4, the tunnel insulating film 3, the channel semiconductor layer 2, and the core insulating film 1 are formed in order on the side surfaces of the stacked film S1 and the insulating film 12 in the memory hole H1.

Figure 4:
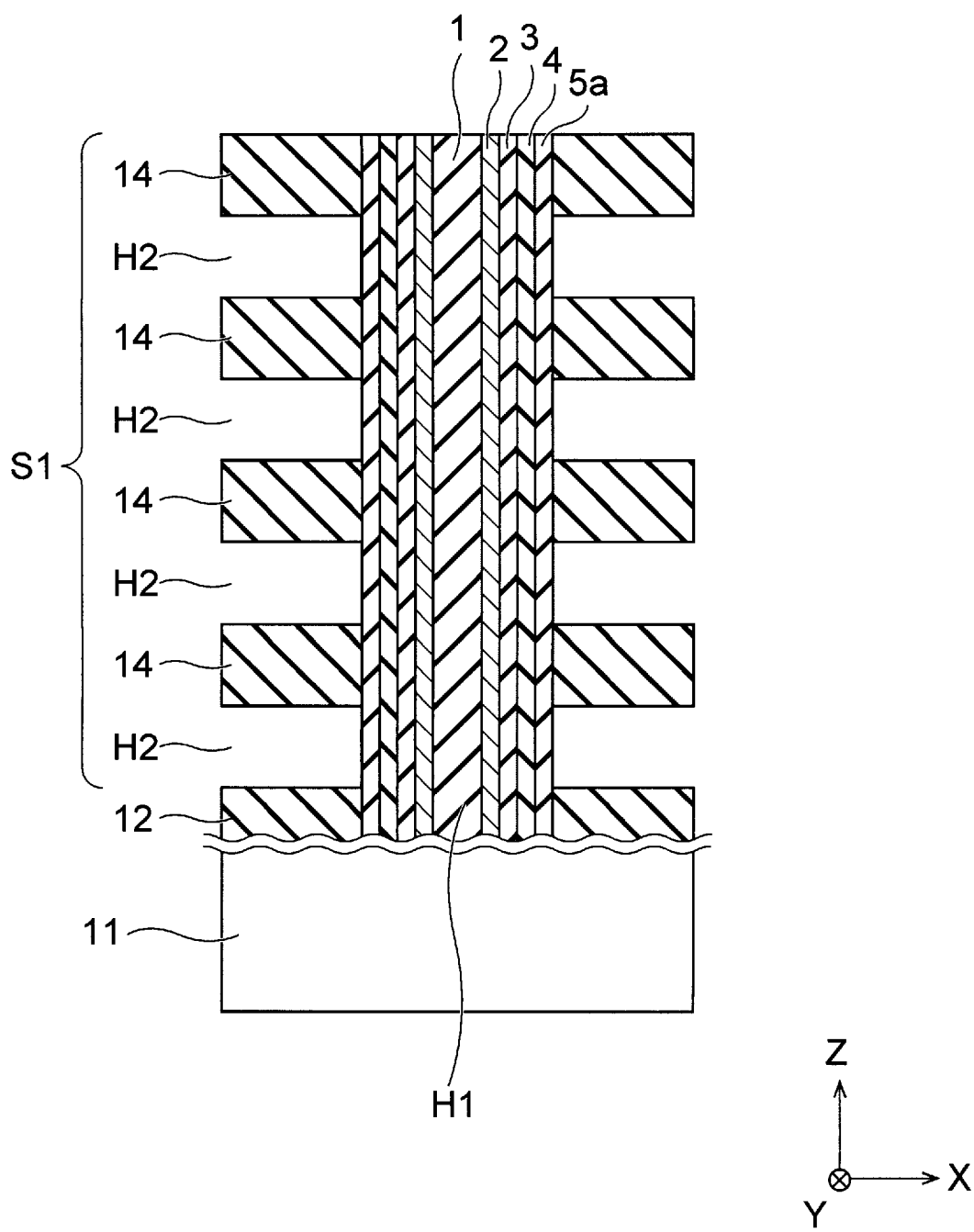
FIG. 4 is a sectional view illustrating the method for manufacturing the semiconductor device according to the first embodiment.

Next, a slit (not illustrated) is formed in the stacked film S1, and the sacrifice layers 13 are removed with a chemical solution such as a phosphoric acid using the slit. As a result, a plurality of hollows H2 are formed between the insulating layers 14 (FIG. 4).

Figure 5:
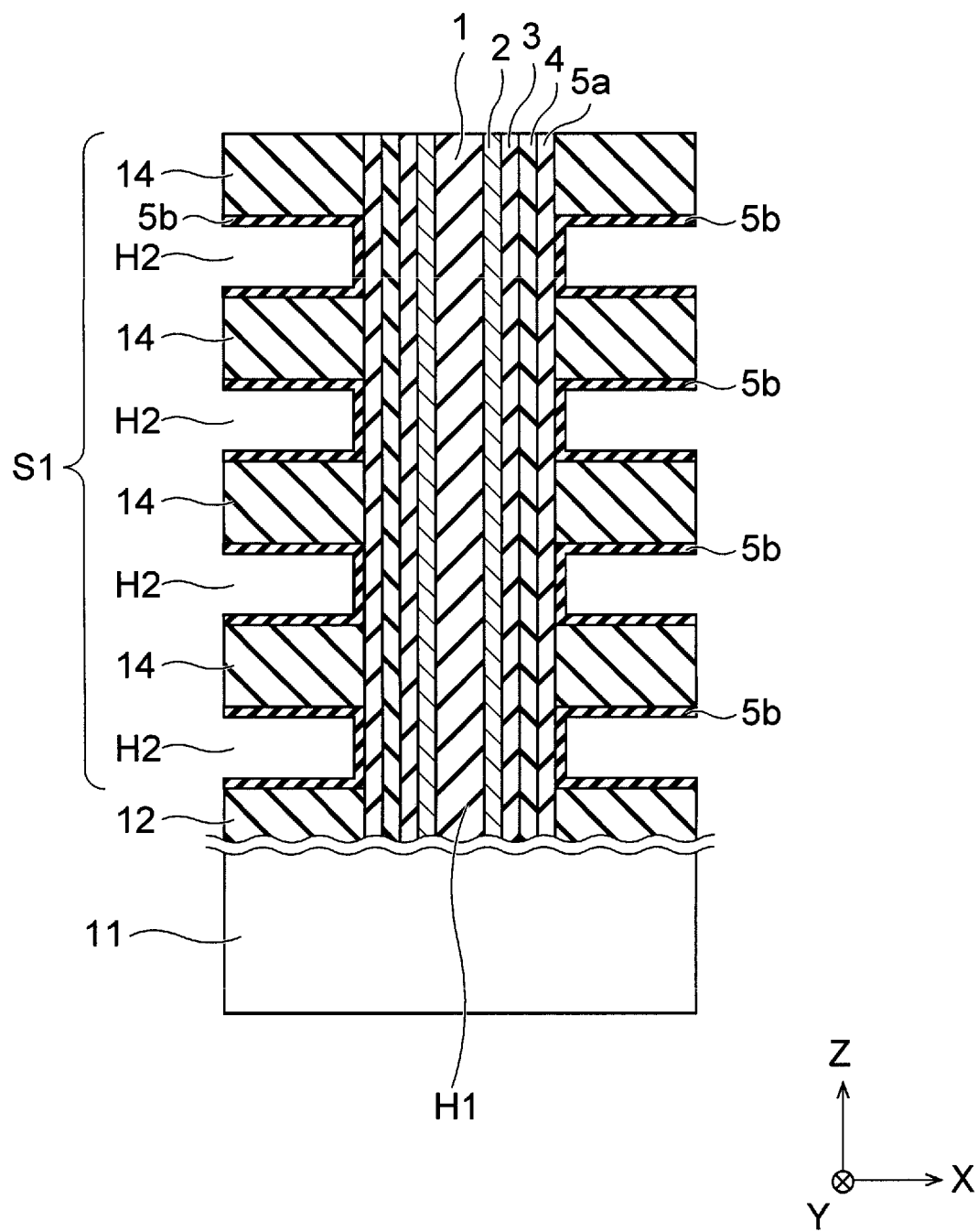
FIG. 5 is a sectional view illustrating the method for manufacturing the semiconductor device according to the first embodiment.
Figure 6:
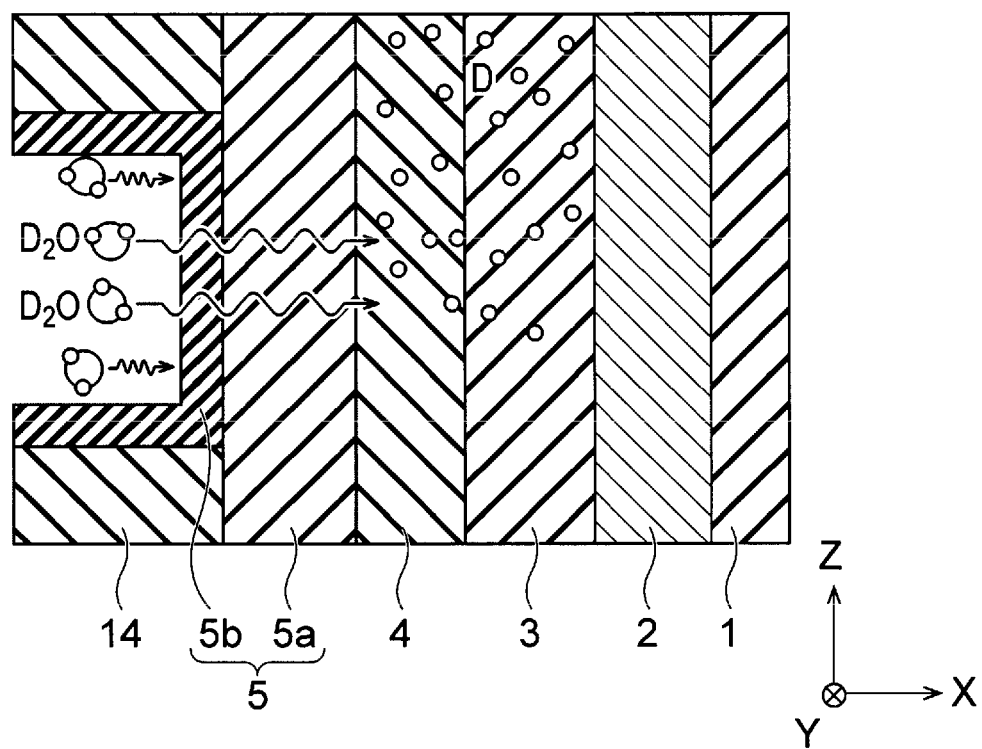
FIG. 6 is a sectional view for showing heat treatment in the method for manufacturing the semiconductor device according to the first embodiment.

Next, the insulating film 5b including aluminum oxide is formed on the surfaces of the insulating layers 14 and the insulating film 5a in these hollows H2 (FIG. 5). As a result, a block insulating film 5 including the insulating film 5a and the insulating film 5b is formed. Subsequently, rapid thermal processing (RTP) is performed under a heat load condition of 1000° C. or more, for example, using heavy water ($D_2O$). Thus, crystallization and film quality of the insulating film 5b including aluminum oxide (AlO) are improved, and deuterium (D) is introduced into the cell stacked film, for example, the charge storage film 4 and the tunnel insulating film 3 as illustrated in FIG. 6. Here, FIG. 6 is a sectional view illustrating how deuterium (D) is introduced into one of the hollows H2.

Figure 7:
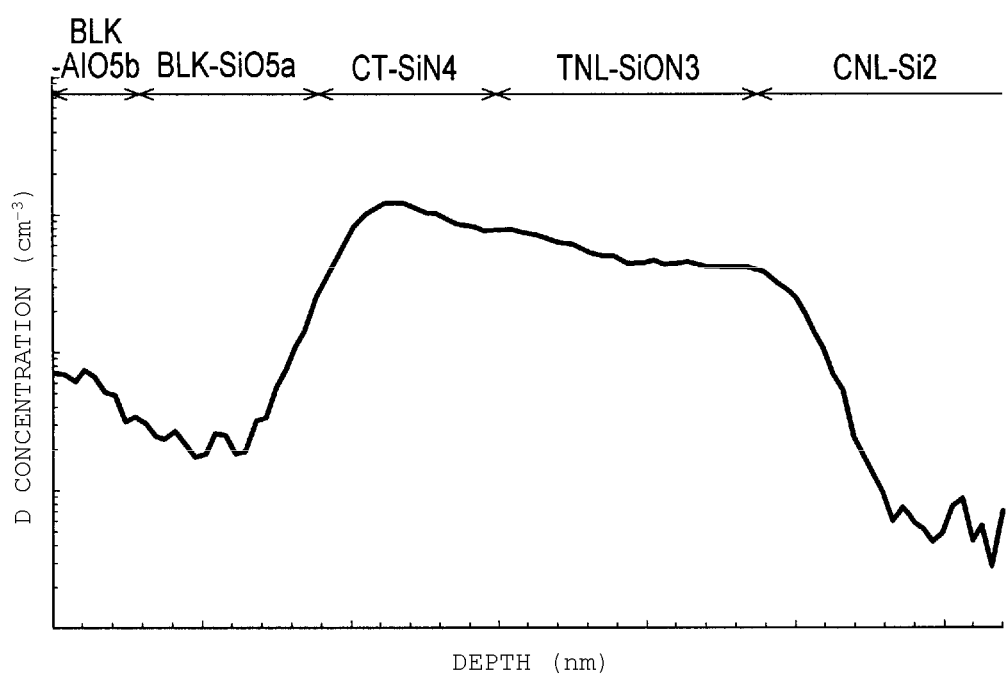
FIG. 7 is a graph illustrating distribution of deuterium introduced into a cell stacked film in the heat treatment illustrated in FIG. 6.

Distribution of the concentration in a depth direction after the introduction of deuterium (D) is illustrated in FIG. 7. The horizontal axis represents the depth in the X direction from the insulating film 5b including AlO (depth), that is, the distance in the X direction. In other words, the horizontal axis represents distances of the insulating film 5b, the insulating film 5a including SiO, the charge storage film 4 including SiN, the tunnel insulating film 3 including SiON, and the channel semiconductor layer 2 in the depth direction from the surface of the insulating film 5b including AlO. The vertical axis represents the concentration of deuterium (D).

As can be understood from FIG. 7, deuterium (D) is introduced mainly into the charge storage film 4 including SiN and the tunnel insulating film 3 including SiON. Then, the average concentrations of deuterium (D) in the cell stacked film are lower in order of the charge storage film 4>the tunnel insulating film>the insulating film 5b>insulating film 5a. In other words, the average concentrations are lower in order of the charge storage film 4, an interface between the charge storage film 4 and the tunnel insulating film 3, and the tunnel insulating film 3. Here, the average concentration of each film is a value obtained by integrating concentration distribution along the depth direction of the corresponding film and dividing the integrated value by the thickness of the corresponding film (the thickness in the X direction). Also, the boundary between the charge storage film 4 including SiN and the tunnel insulating film 3 including SiON can be determined from SiN intensity and O intensity analysis curves in secondary ion mass spectrometry (SIMS) analysis.

As described above, it is possible to form a structure in which the interface between the charge storage film 4 and the tunnel insulating film 3 is terminated with deuterium (D) as in the embodiment. If writing/erasing operations are repeated, defects may occur in the charge storage film 4 and the tunnel insulating film 3, and a part of charge stored in the charge storage film 4 escapes from the defects. This may cause data loss. The defects in the charge storage film 4 and the tunnel insulating film 3 are considered to occur due to hydrogen (H) introduced intentionally or unintentionally at the time of formation of the memory cell being desorbed due to electrical stress caused by the writing/erasing operations.

In the SiN film and the SiON film, an N—H bond is substituted with an N-D bond if deuterium (D) is introduced into the films. The N-D bond has significantly stronger electrical stress resistance than that of the N—H bond. In other words, it is possible to obtain a bond that is strong against electrical stress by substituting a portion that may become a bond defect with deuterium (D). Therefore, if it is possible to reduce the N—H bond and to increase the N-D bond in the charge storage film 4 and the tunnel insulating film 3, it is possible to curb degradation of the charge storage film 4 and the tunnel insulating film 3 due to writing/erasing operations. Also, it is possible to curb erroneous writing at the time of writing and reading. Moreover, it is possible to obtain the effect of curbing degradation of reliability when the writing and erasing operations are repeated. It is thus possible to obtain a semiconductor device capable of curbing degradation of reliability of the memory cell.

Figure 8:
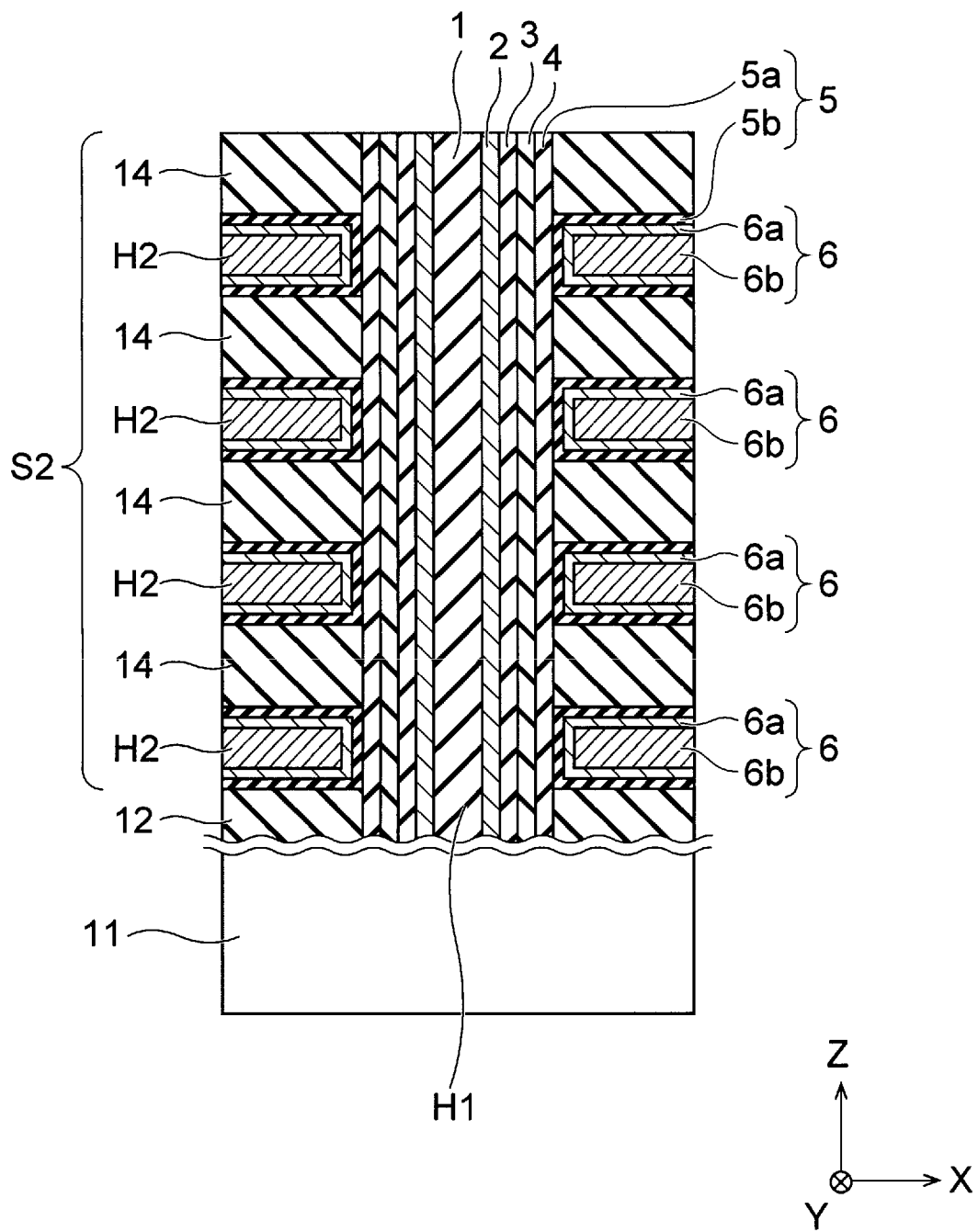
FIG. 8 is a sectional view illustrating the method for manufacturing the semiconductor device according to the first embodiment.

After the RTP is performed using heavy water ($D_2O$) in this manner, the barrier metal layer 6a and the electrode material layer 6b are formed in order on the surface of the insulating film 5b in each hollow H2 using an ordinary process (FIG. 8). As a result, the electrode layer 6 including the barrier metal layer 6a and the electrode material layer 6b is formed in each hollow H2, and a stacked film S2 including the plurality of electrode layers 6 and the plurality of insulating layers 14 alternately stacked is formed on the insulating film 12. The processing of removing the sacrifice layers 13 and forming the insulating film 5b, the barrier metal layer 6a, and the electrode material layer 6b is called replacement processing.

In this manner, the semiconductor device according to the embodiment is manufactured (FIG. 8). FIG. 1 illustrates a portion of the semiconductor device illustrated in FIG. 8.

As described above, it is possible to obtain a semiconductor device capable of curbing degradation of reliability of the memory cell according to the embodiment.

First Modification Example

In the first embodiment, heavy water ($D_2O$) is used for the introduction of deuterium (D) into the cell stacked film. In a first modification example of the first embodiment, mixture gas of heavy water ($D_2O$) and deuterium ($D_2$) gas is used. Manufacturing processes similar to those in the first embodiment are performed other than that point.

In regard to diffusibility in the SiN film, although substitution between hydrogen (H) and deuterium (D) is enabled with lower activation energy for a $D_2O$ molecule than for a $D_2$ molecule, the $D_2O$ molecule has a lower diffusion speed and exhibits satisfactory reactivity in substitution in the SiN film while a reaction using the $D_2$ molecule exhibits higher superiority in the substitution in the SiON film. Thus, it is possible to facilitate the substitution from the N—H bond to the N-D bond in the layer of the charge storage film 4 and in the film of the tunnel insulating film 3 using the mixture gas of heavy water ($D_2O$) and deuterium ($D_2$) as in the first modification example. In other words, it is possible to obtain a stronger bond against electrical stress in the first modification example than in the first embodiment.

As described above, according to the first modification example, it is possible to obtain an effect equivalent to the reliability improvement effect of the memory cell obtained in the first embodiment.

Moreover, the modification example can provide oxidation selectivity between tungsten (W) included in the electrode layer 6 and the charge storage layer (SiN) by setting a partial pressure ratio between heavy water ($D_2O$) and deuterium (D) to 60% or less. In this manner, it is possible to crystallize Ala, to perform oxidation reforming, and to introduce deuterium (D) into the cell stacked film without causing abnormal oxidation even in the structure in which tungsten (W) is erroneously exposed at the time of forming the memory hole and without causing biting oxidation of the charge storage film 4. Also, it is most desirable to mix heavy water ($D_2O$) and deuterium ($D_2$) gas as an oxidative annealing atmosphere in terms of the introduction of the deuterium (D). At this time, the pressure in a chamber may be controlled using nitrogen ($N_2$). The RTP at 900° C. or more is performed in the first modification example as well. As compared with the case in which only heavy water is used, it is possible to reduce a heat load at least at 100° C. in the same processing time.

Second Modification Example

In a second modification example of the first embodiment, mixture gas of heavy water ($D_2O$) gas and hydrogen ($H_2$) gas is used to introduce deuterium (D) into the cell stacked film. Processing other than this point is performed similarly to the first embodiment. Similarly to the first modification example, no problem occurs in the introduction of deuterium (D) even if the partial pressure of heavy water ($D_2O$) is 100 torr or more. An effect similar to that in the first embodiment can be obtained in the second modification example as well. Also, the effect of reducing a heat load in the RTP is not obtained, and a heat load equivalent to that in the first embodiment is needed in the modification example.

In addition, the annealing processing using heavy water (D₂O) described in the first embodiment may be referred to as "wet oxidation".

Second Embodiment

A method for manufacturing a semiconductor device according to a second embodiment will be described with reference to FIGS. 9 and 10.

In the first embodiment, the first modification example, and the second modification example, deuterium (D) is introduced into the cell stacked film via the insulating film 5b, and degradation of reliability of the memory cell is curbed by carrying out the RTP using gas including heavy water (D₂O) after forming the insulating film 5b.

On the other hand, degradation of reliability of the memory cell is curbed by performing heat treatment for reducing impurities (for example, a Cl element (chlorine)) a charge storage film 4 in the second embodiment.

Processes similar to those in the first embodiment up to the processes illustrated in FIG. 5 in the first embodiment are performed to form an insulating film 5b including AlO in each hollow H2. Subsequently, wet oxidation is performed using heavy water (D₂O) diluted with hydrogen (H₂) gas or deuterium (D₂) gas as illustrated in FIG. 9. The wet oxidation is performed using a vertical annealing furnace or a single-wafer-type RTP device in a heat treatment atmosphere within a range of 800° C. to 1100° C. Also, annealing to crystallize the insulating film 5b including AlO may be performed before the wet oxidation.

Figure 10:
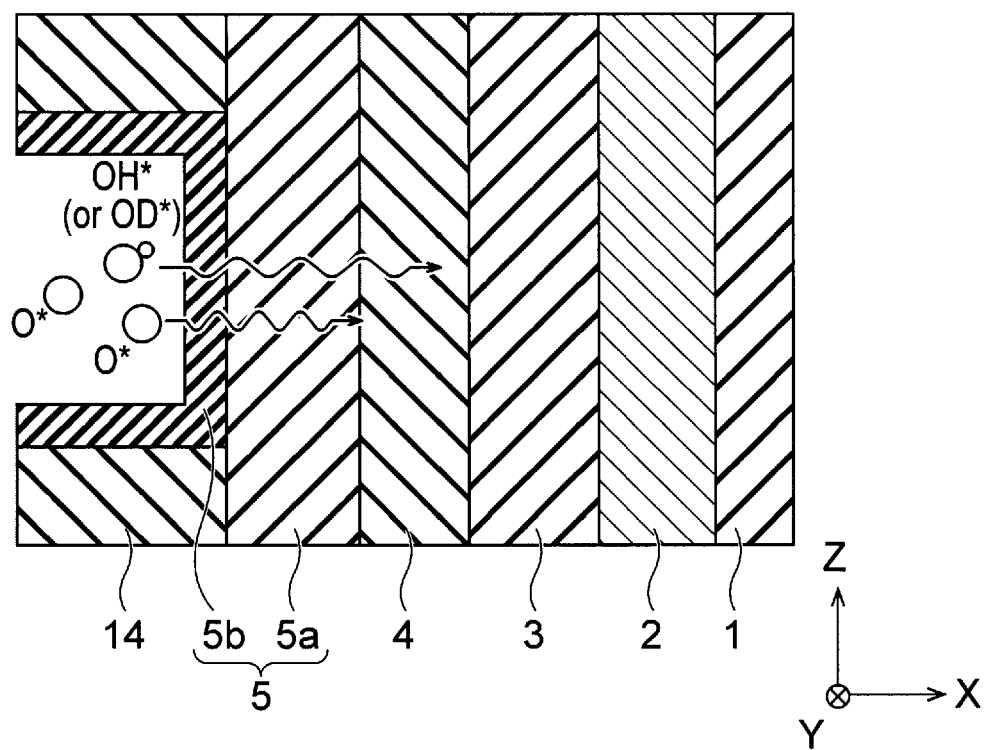
FIG. 10 is a sectional view for showing heat treatment in the method for manufacturing the semiconductor device according to the second embodiment.

Subsequently, radical oxidation is performed as illustrated in FIG. 10. The radical oxidation is performed in a heating furnace or RTP using OH* or OD* and an oxygen radical (O*). The heat treatment atmosphere is within a range of 800° C. to 1100° C. Also, the oxygen radical (O*) may be formed from oxygen (O₂) gas using a plasma generation mechanism.

Figure 9:
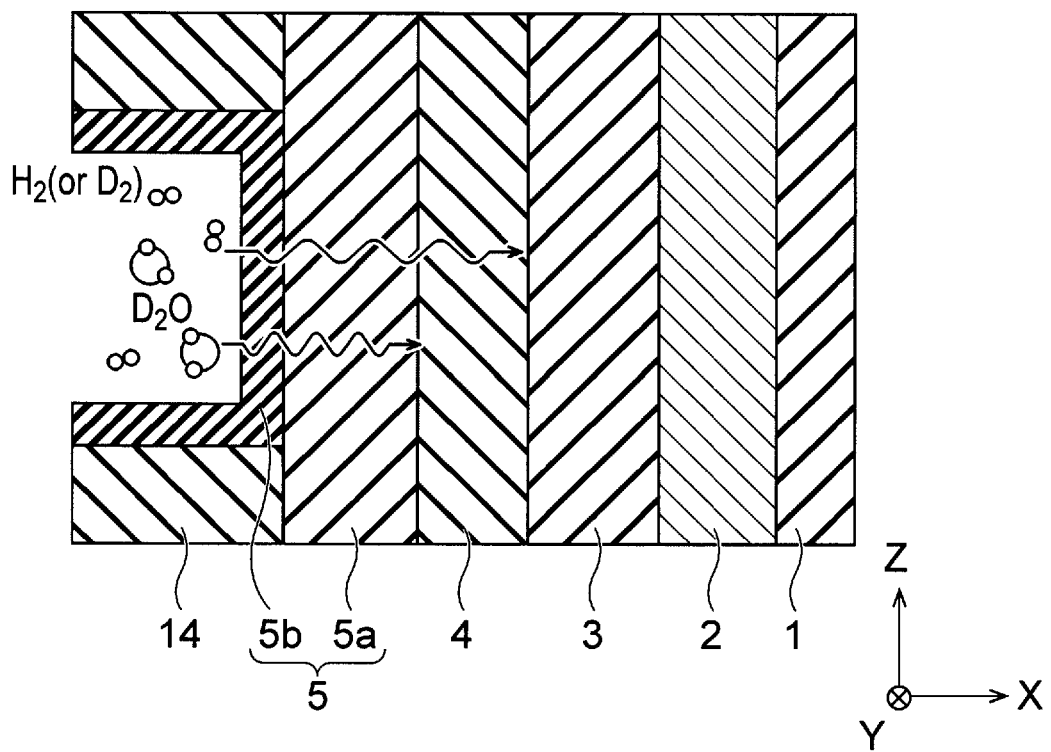
FIG. 9 is a sectional view for showing heat treatment in a method for manufacturing a semiconductor device according to a second embodiment.

Subsequently, wet oxidation is performed using heavy water (D₂O) diluted with hydrogen (H₂) gas or deuterium (D₂) gas as illustrated in FIG. 9.

It is possible to reduce impurity Cl elements (chlorine) from the charge storage film 4 including SiN through such processing.

Thereafter, processes similar to those in the first embodiment are performed, and the semiconductor device illustrated in FIG. 8 can thus be obtained.

Figure 21:
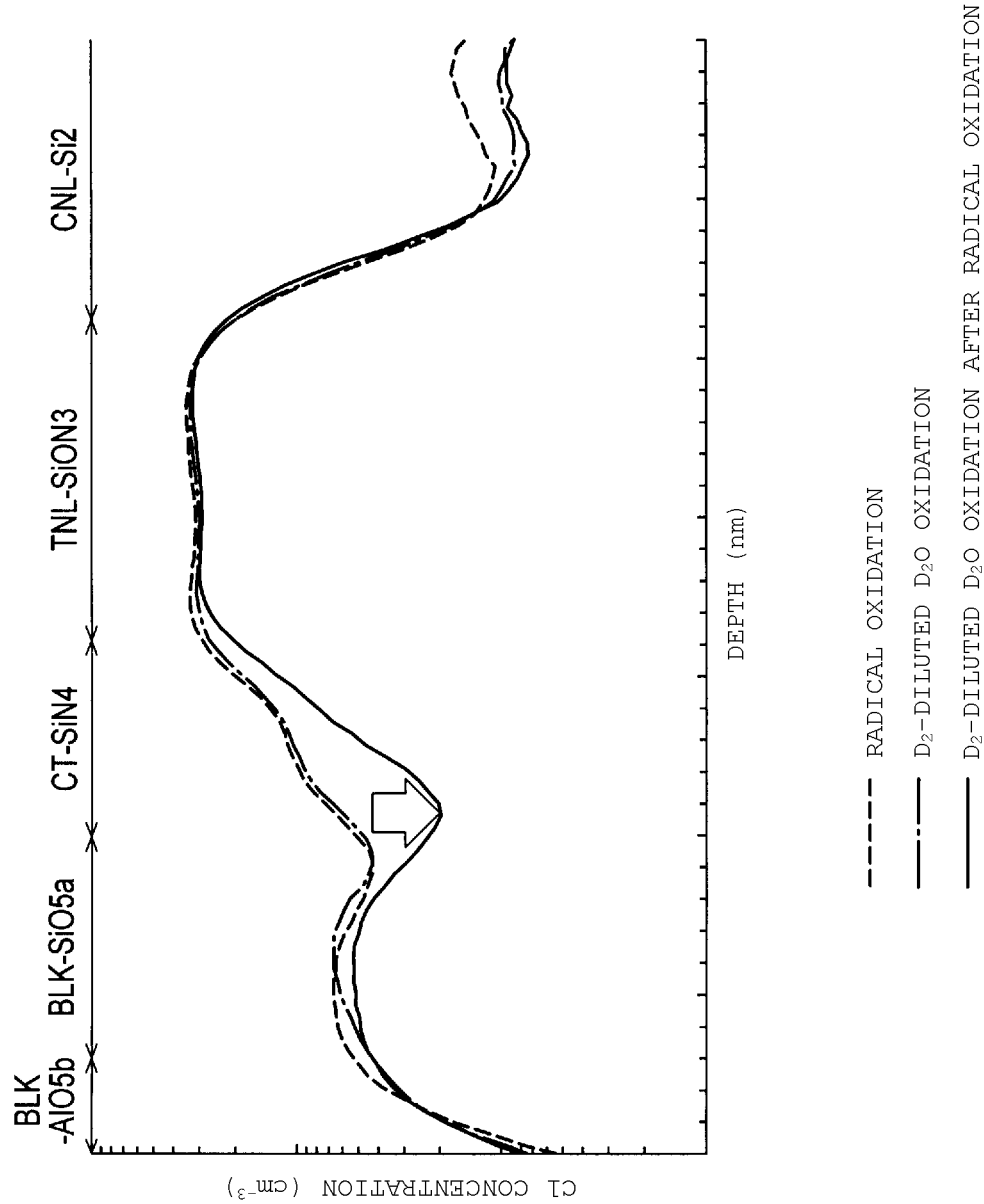
FIG. 21 is a diagram illustrating an impurity concentration profile when hydrogen-diluted wet oxidation is carried out on a cell insulating film after radical oxidation.

FIG. 21 illustrates, by a dashed line, a concentration profile of the impurities (C1) when radical oxidation is performed on the block insulating film 5 including aluminum oxide, illustrates, by a chain line, a concentration profile of the impurities (Cl) when D₂O oxidation (wet oxidation) diluted with deuterium (D₂) is performed, and illustrates, by a solid line, a concentration profile of the impurities (Cl) when D₂O oxidation (wet oxidation) diluted with deuterium (D₂) is performed after radical oxidation. As can be understood from FIG. 21, if D₂O oxidation (wet oxidation) with diluted deuterium (D₂) is performed after radical oxidation, then the impurities Cl are reduced in the charge storage layer (CT) near the interface with the block insulating film (BLK) at the charge center position. In this manner, an electron trap level in the charge storage layer is deepened, and an improvement in charge holding property is expected.

Figure 22:
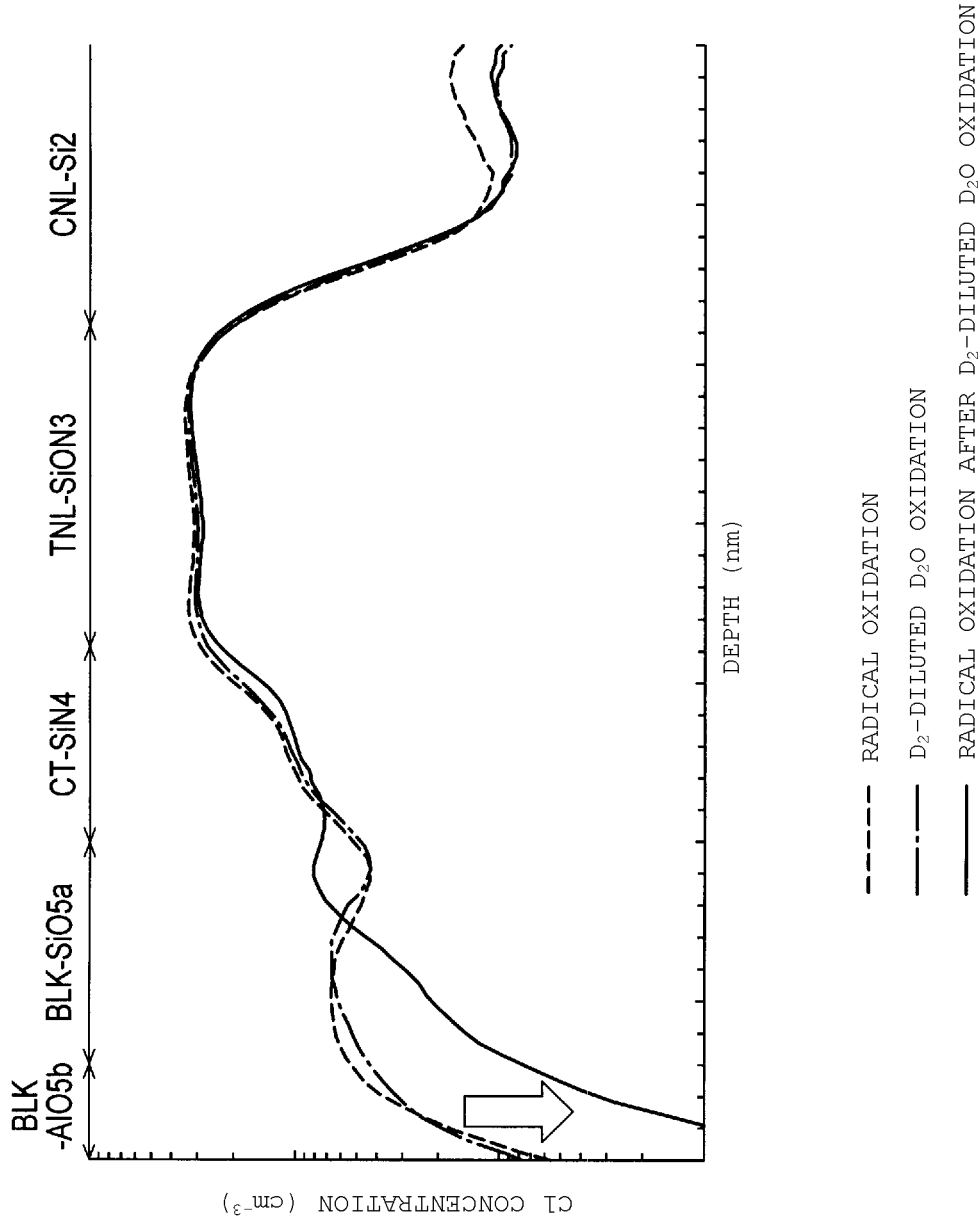
FIG. 22 is a diagram illustrating an impurity concentration profile when hydrogen-diluted wet oxidation is carried out on the cell insulating film after hydrogen-diluted wet oxidation.

FIG. 22 illustrates, by a dashed line, a concentration profile of impurities (Cl) when radical oxidation is performed on the block insulating film 5 including aluminum oxide, illustrates, by a chain line, a concentration profile of impurities (Cl) when D₂O oxidation (wet oxidation) diluted with deuterium (D₂) is performed, and illustrates, by a solid line, a concentration profile of the impurities (Cl) when radical oxidation is performed after the D₂O oxidation (wet oxidation) diluted with deuterium (D₂). As can be understood from FIG. 22, if radical oxidation is performed after D₂O oxidation (wet oxidation) diluted with deuterium (D₂), the concentration of the impurities (Cl) is reduced in aluminum oxide and silicon oxide in the block insulating film. In this manner, film quality of the charge storage layer is improved, a back tunneling property is improved, and a charge holding property is enhanced.

As described above, it is possible to curb degradation of reliability of the memory cell according to the second embodiment.

Modification Example

In the second embodiment, the heat treatment is performed in the order of the wet oxidation processing, the radical oxidation processing, and the wet oxidation processing. In a modification example, the radical oxidation processing, the wet oxidation processing, and the radical oxidation processing are performed in this order. It is possible to reduce the impurity Cl elements (chlorine) in the charge storage film 4 including SiN and to curb degradation of reliability of the memory cell in the modification example as well. Also, annealing to crystallize the insulating film 5b including AlO may be performed before the radical oxidation processing in the modification example.

Third Embodiment

A semiconductor device according to a third embodiment will be described with reference to FIGS. 11 to 18. FIGS. 11 to 18 are sectional views illustrating a method for manufacturing a semiconductor device according to the third embodiment.

Figure 11:
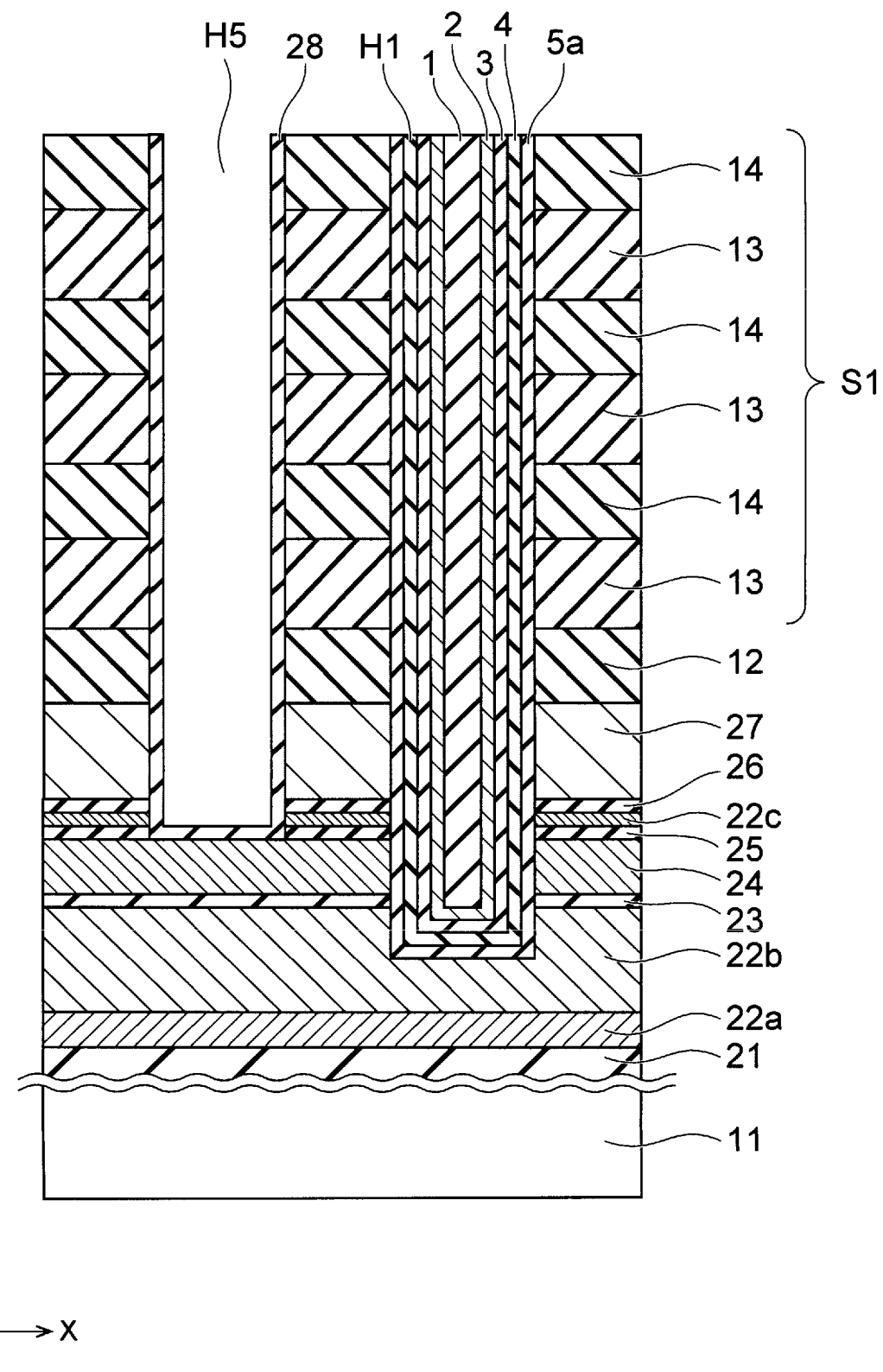
FIG. 11 is a sectional view illustrating a method for manufacturing a semiconductor device according to a third embodiment.

FIG. 11 illustrates a section after a slit (H5) is formed in a stacked film S1 in the process illustrated in FIG. 4 and before sacrifice layers 13 are removed in the process illustrated in FIG. 4. FIG. 11 illustrates an insulating film 5a, a charge storage film 4, a tunnel insulating film 3, a channel semiconductor layer 2, and a core insulating film 1 formed in order in a memory hole H1. The insulating film 5a, the charge storage film 4, and the tunnel insulating film 3 in FIG. 11 have not been removed from the bottom portion of the memory hole H1 and remain. Such a structure is employed when the stacked film S1 is thick, for example.

FIG. 11 further illustrates an insulating film 21, a metal layer 22a, a lower semiconductor layer 22b, an insulating film 23, a semiconductor layer 24, an insulating film 25, an upper semiconductor layer 22c, an insulating film 26, and a gate layer 27 formed in order above a substrate 11. The insulating film 12 in the embodiment is formed via these insulating films and layers above the substrate 11 in the processes in FIG. 2. The insulating film 21 is, for example, a silicon oxide film. The metal layer 22a is, for example, a W layer. The lower semiconductor layer 22b is, for example, a polysilicon layer. The insulating film 23 is, for example, a silicon oxide film. The semiconductor layer 24 is, for example, a polysilicon layer. The insulating film 25 is, for example, a silicon oxide film. The upper semiconductor layer 22c is, for example, a polysilicon layer. The insulating film 26 is, for example, a silicon oxide film. The gate layer 27 is, for example, a polysilicon layer. The metal layer 22a, the lower semiconductor layer 22b, and the upper semiconductor layer 22c configure a source line 22. In other words, the channel semiconductor layer 2 is electrically connected to the source line 22. Here, A and B being electrically connected may mean that A and B may be connected directly to each other or A and B may also be connected indirectly to each other via a conductor.

The memory hole H1 in the embodiment is formed to penetrate through the stacked film S1, the insulating film 12, the gate layer 27, the insulating film, 26, the upper semiconductor layer 22c, the insulating film 25, the semiconductor layer 24, and the insulating film 23 and reach the lower semiconductor layer 22b in the process in FIG. 2. The insulating film 5a, the charge storage film 4, the tunnel insulating film 3, the channel semiconductor layer 2, and the core insulating film 1 are formed in order in the memory hole H1 in the processes in FIG. 3.

In the processes illustrated in FIG. 11, the slit H5 is formed to penetrate through the stacked film S1, the insulating film 12, the gate layer 27, the insulating film 26, the upper semiconductor layer 22c, and the insulating film 25 and reach the semiconductor layer 24. The slit H5 is an example of a first recess portion. In the process in FIG. 11, an insulating film 28 is further formed on the side surface and the bottom surface of the slit H5. The insulating film 28 is, for example, a SiN film.

Figure 12:
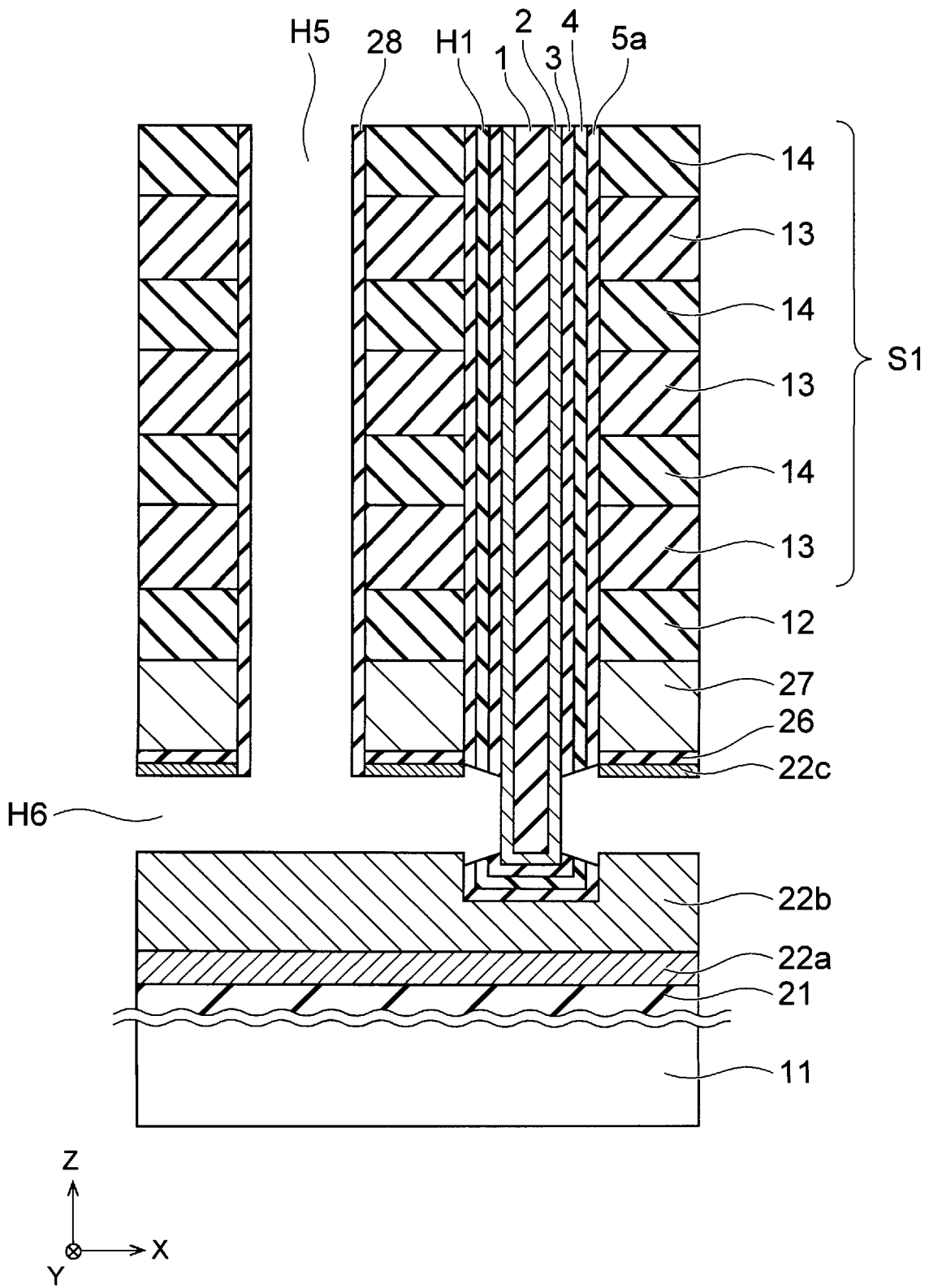
FIG. 12 is a sectional view illustrating the method for manufacturing the semiconductor device according to the third embodiment.

Next, the insulating film 28 is removed from the bottom portion of the slit H5 through etching, and the semiconductor layer 24 is removed through wet etching using the slit H5 (FIG. 12). As a result, a hollow H6 is formed between the insulating film 25 and the insulating film 23. Next, the insulating film 25 and the insulating film 23 are removed, and the insulating film 5a exposed to the inside of the hollow H6, the charge storage film 4, and the tunnel insulating film 3 are processed through chemical dry etching (CDE) using the slit H5 and the hollow H6 (FIG. 10). As a result, the volume of the hollow H6 is enlarged, and the side surface of the channel semiconductor layer 2 is exposed to the inside of the hollow H6.

Figure 13:
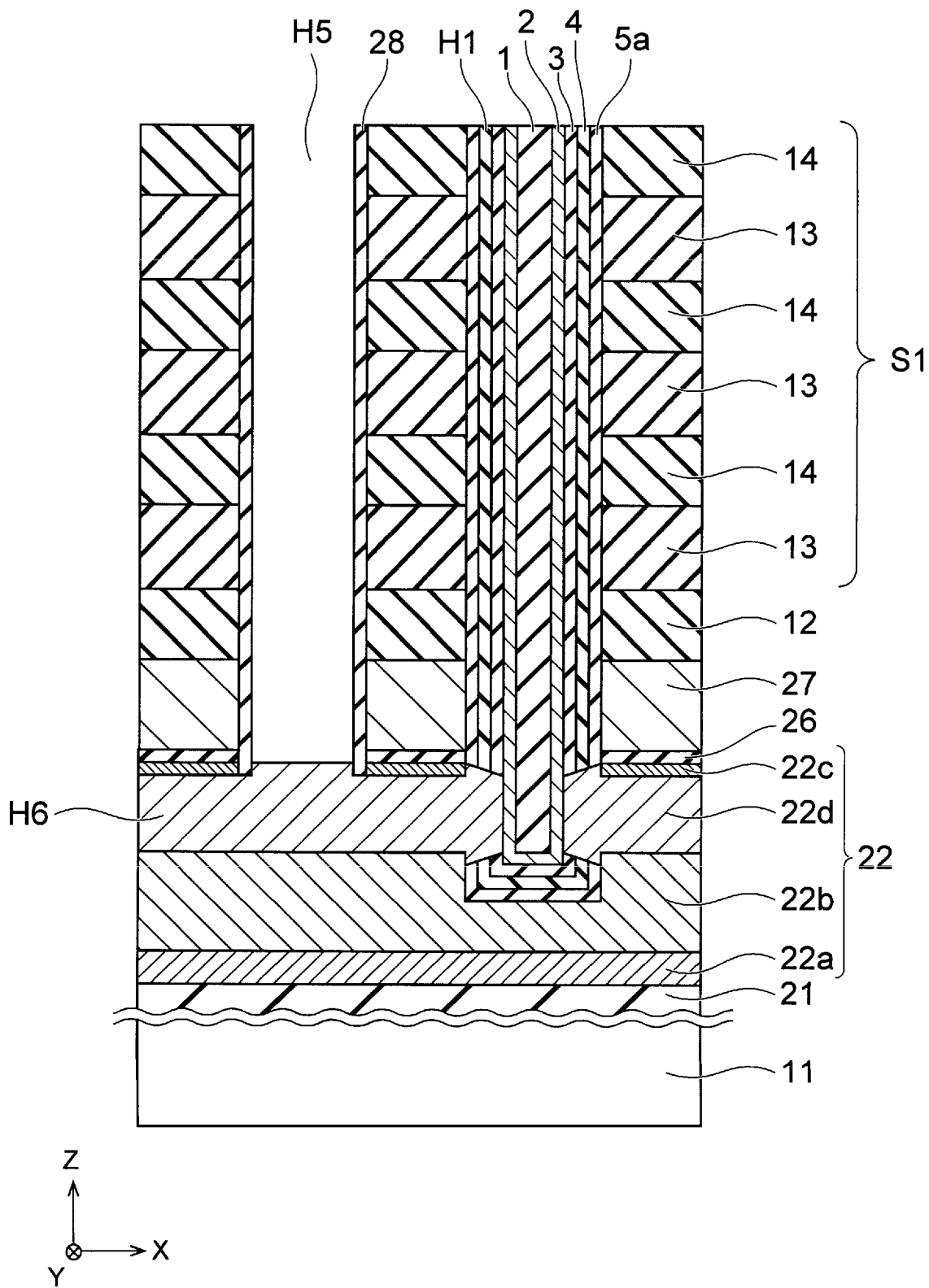
FIG. 13 is a sectional view illustrating the method for manufacturing the semiconductor device according to the third embodiment.

Next, an intermediate semiconductor layer 22d is formed in the hollow H6 (FIG. 13). As a result, the intermediate semiconductor layer 22d is formed between the lower semiconductor layer 22b and the upper semiconductor layer 22c, and the source line 22 including the metal layer 22a, the lower semiconductor layer 22b, the intermediate semiconductor layer 22d, and the upper semiconductor layer 22c in order is formed. The intermediate semiconductor layer 22d is, for example, a polysilicon layer doped with phosphorus (P). The source line 22 is electrically connected to the channel semiconductor layer 2 with the intermediate semiconductor layer 22d.

Figure 14:
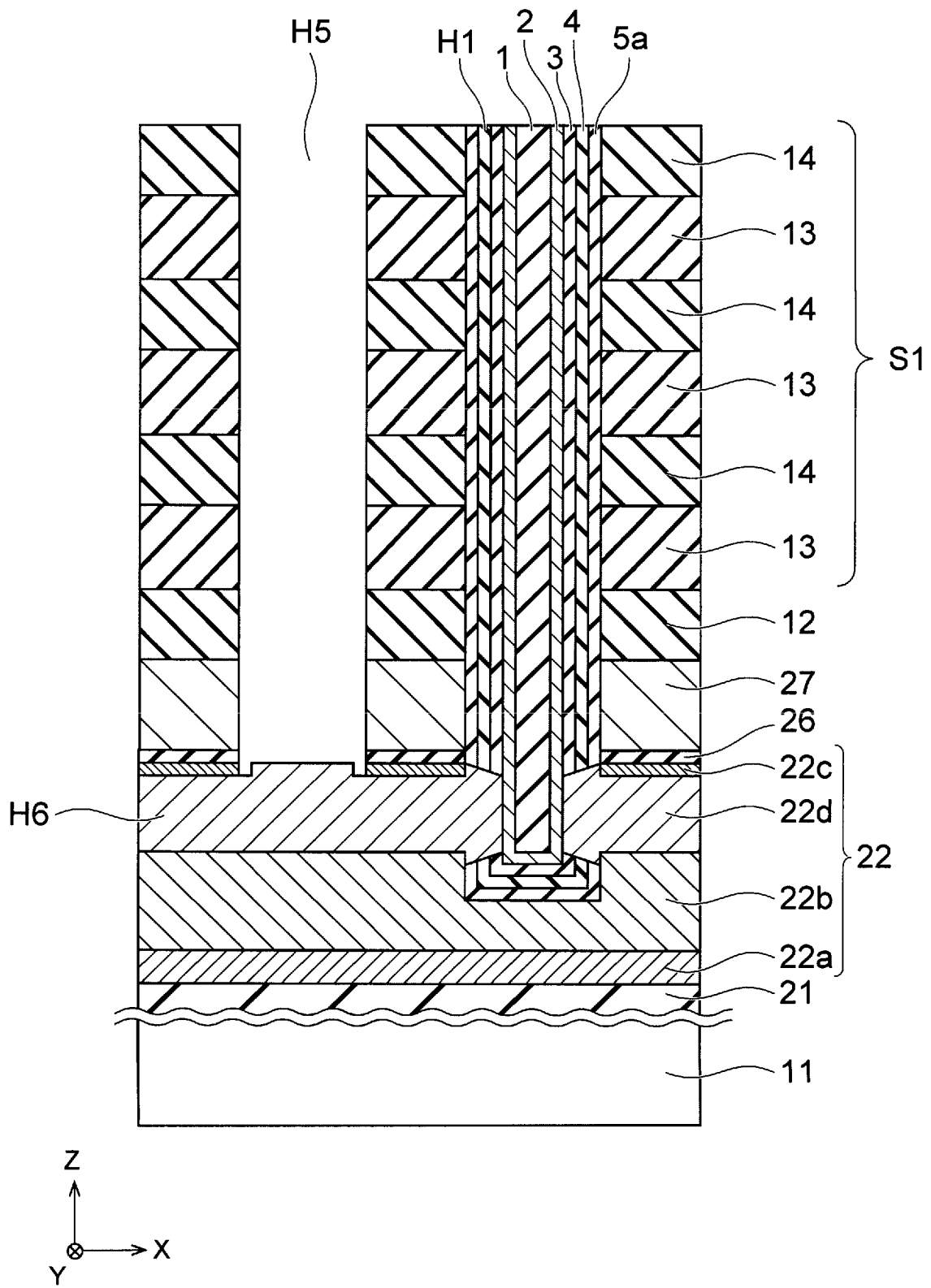
FIG. 14 is a sectional view illustrating the method for manufacturing the semiconductor device according to the third embodiment.

Next, the insulating film 28 is removed from the slit H5 (FIG. 14). As a result, the side surface of the stacked film S1 is exposed to the inside of the slit H5.

Figure 15:
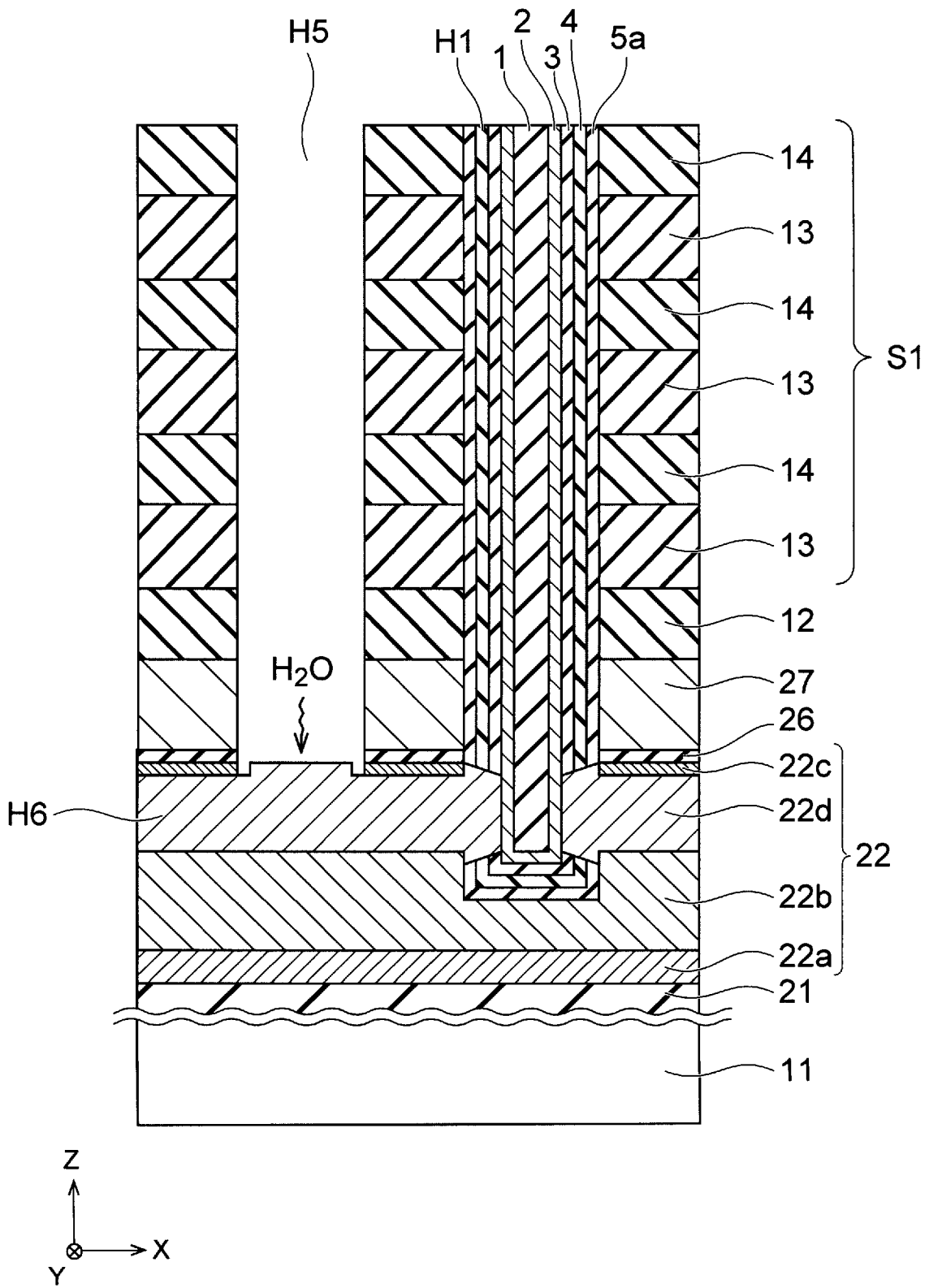
FIG. 15 is a sectional view illustrating the method for manufacturing the semiconductor device according to the third embodiment.
Figure 16:
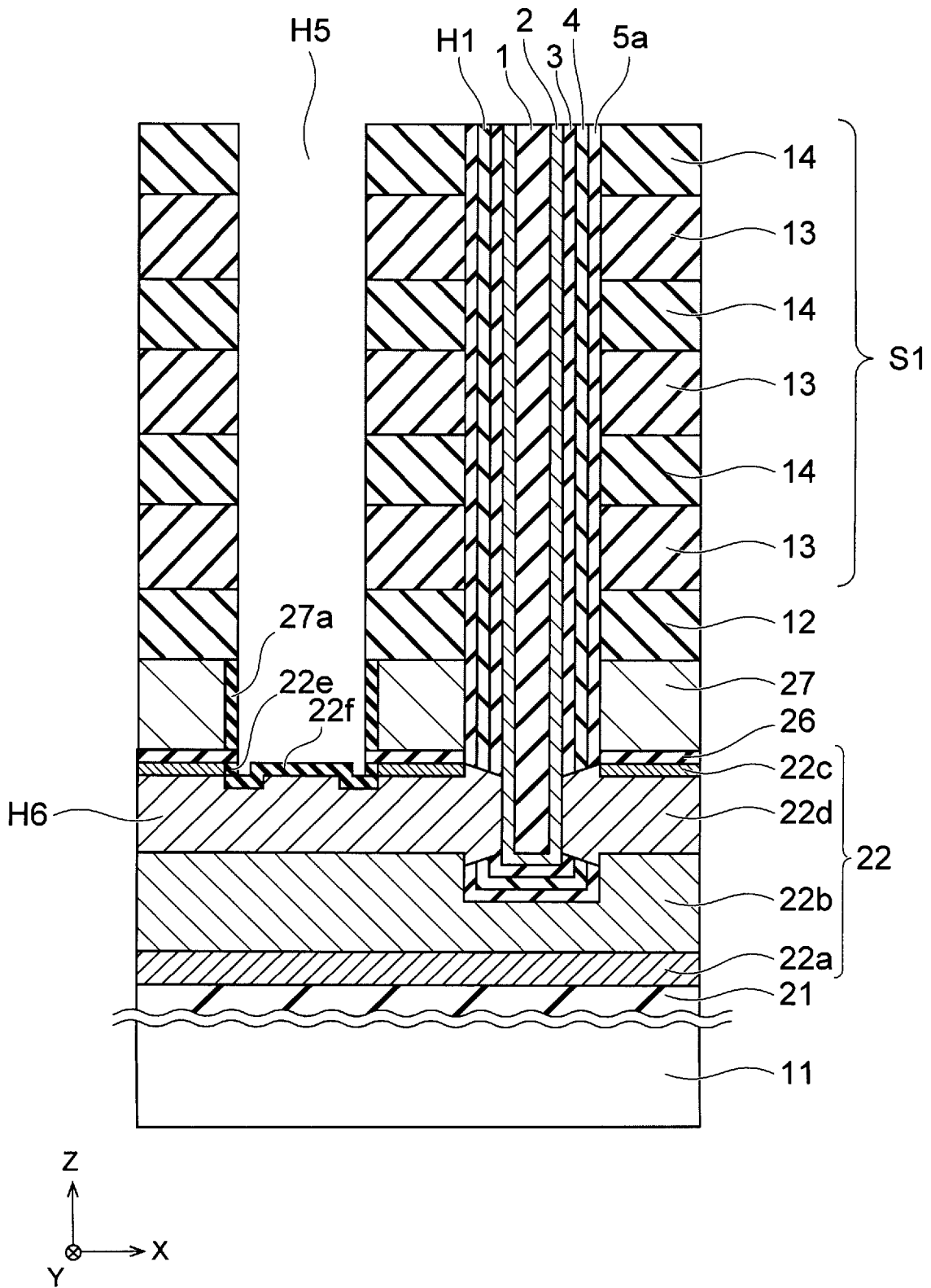
FIG. 16 is a sectional view illustrating the method for manufacturing the semiconductor device according to the third embodiment.

Next, water vapor ($H_2O$) is supplied into the slit H5, and oxidation processing is performed (FIG. 15). As a result, the surfaces of the upper semiconductor layer 22c, the intermediate semiconductor layer 22d, and the gate layer 27 exposed to the inside of the slit H5 are oxidized with the water vapor, and an oxidized film 22e (a SiO film, for example) formed through oxidation of the surface of the upper semiconductor layer 22c, an oxidized film 22f (a SiO film, for example) formed through oxidation of the surface of the intermediate semiconductor layer 22d, and an oxidized film 27a (a SiO film, for example) formed through oxidation of the surface of the gate layer 27 occur as illustrated in FIG. 16.

Figure 17:
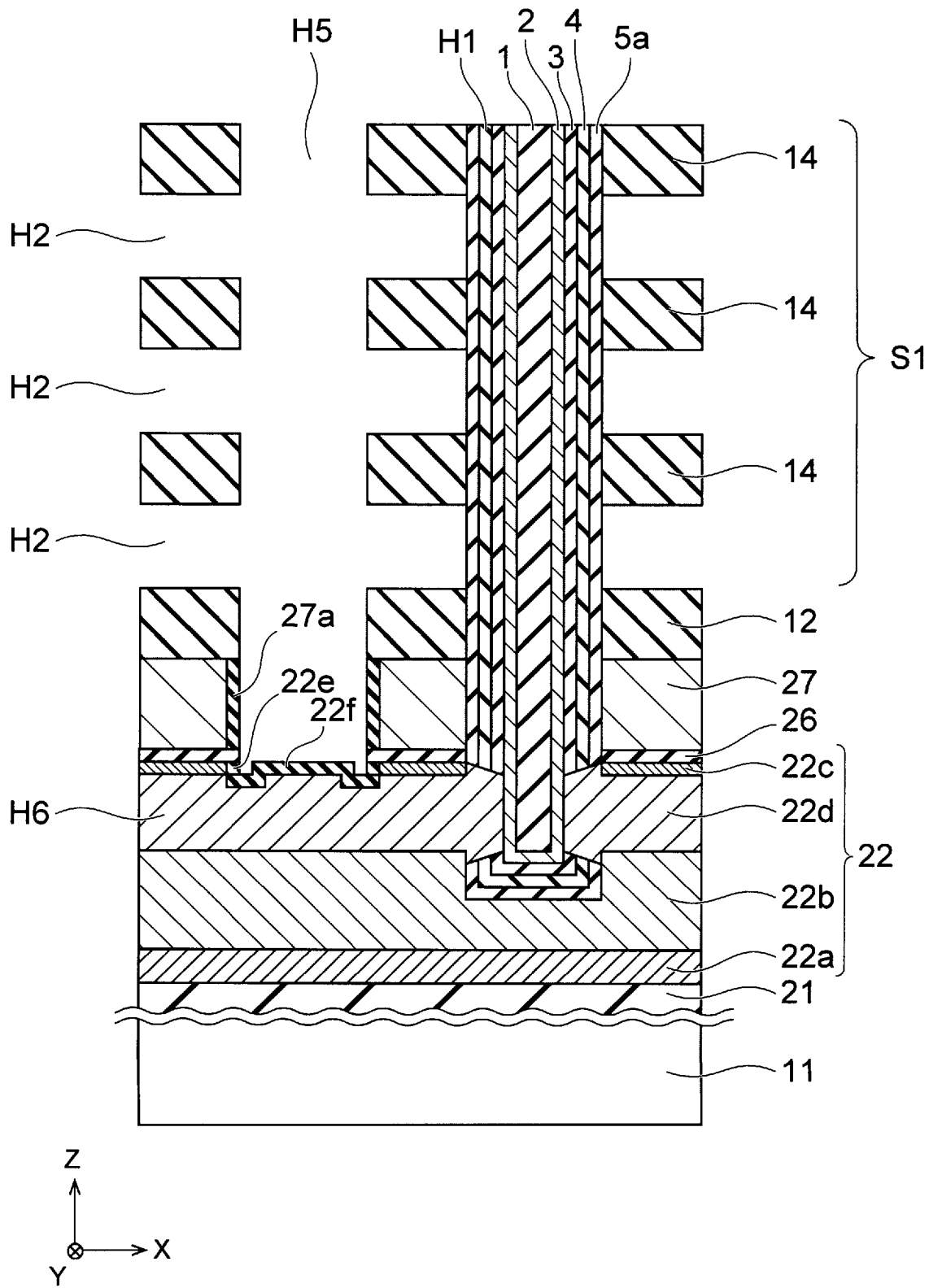
FIG. 17 is a sectional view illustrating the method for manufacturing the semiconductor device according to the third embodiment.

Next, the sacrifice layers 13 are removed with a chemical solution such as a phosphoric acid using the slit H5. As a result, a plurality of hollows H2 are formed between the insulating layers 14 (FIG. 17). Since the upper semiconductor layer 22c, the intermediate semiconductor layer 22d, and the gate layer 27 are covered with the oxidized films 22e, 22f, and 27a, the upper semiconductor layer 22c, the intermediate semiconductor layer 22d, and the gate layer 27 are not removed in the process in FIG. 17.

Figure 18:
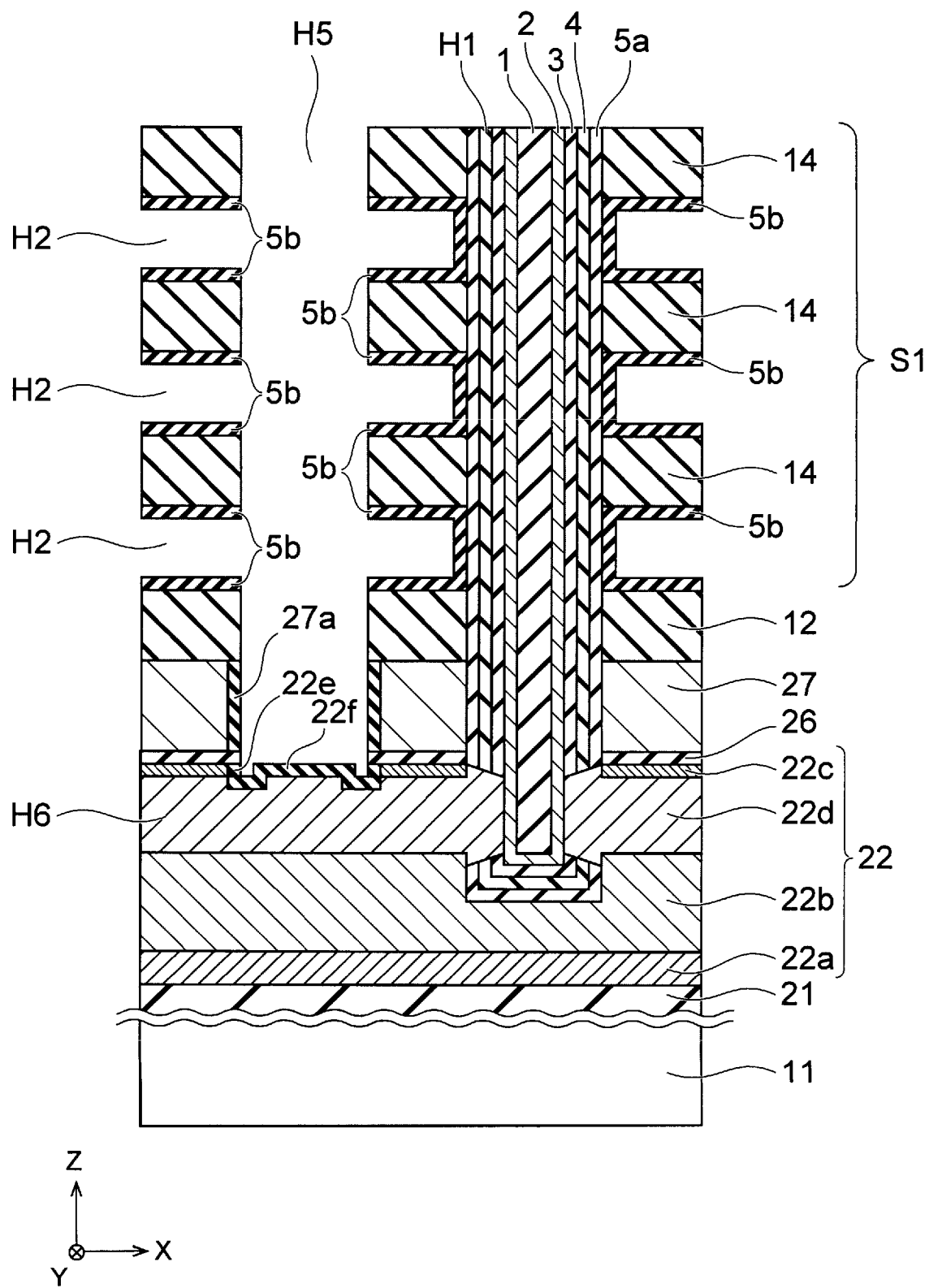
FIG. 18 is a sectional view illustrating the method for manufacturing the semiconductor device according to the third embodiment.

Next, the insulating film 5b including AlO is formed on the surfaces of the insulating layers 14 and the insulating film 5a in the hollows H2 (FIG. 18). Thereafter, deuterium (D) is introduced into the insulating film 5a including SiO, the charge storage film 4 including SiN, and the tunnel insulating film 3 including SiON via the insulating film 5b by performing the heat treatment described any of the first embodiment and the modification examples thereof (FIG. 19).

Figure 20:
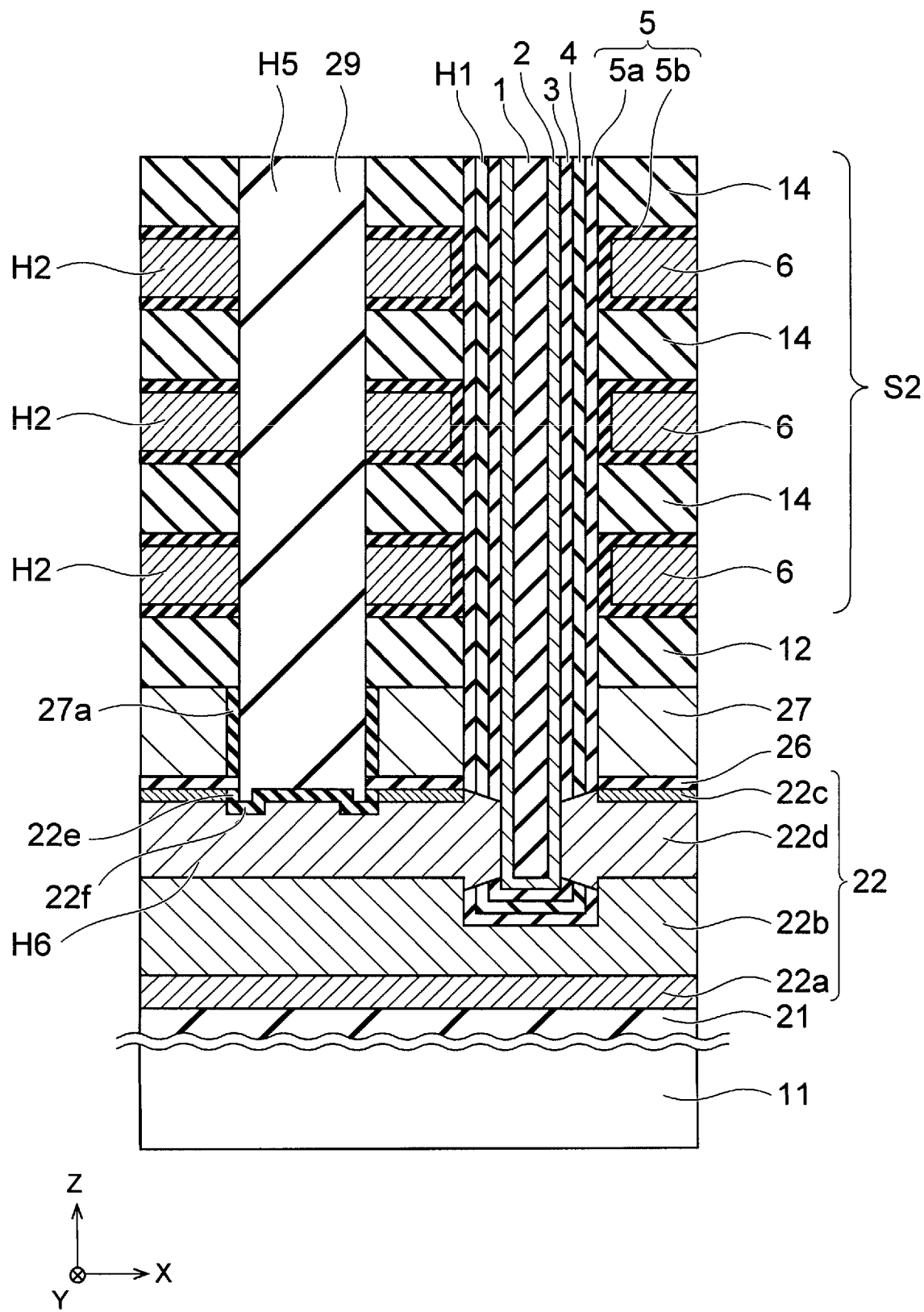
FIG. 20 is a sectional view illustrating the method for manufacturing the semiconductor device according to the third embodiment.

Next, a barrier metal layer 6a and an electrode material layer 6b are formed in order on the surface of the insulating film 5b in the hollow H2 (FIG. 20). As a result, a block insulating film 5 including the insulating film 5a and the insulating film 5b is formed. Moreover, the electrode layers 6 each including the barrier metal layer 6a and the electrode material layer 6b are formed in each hollow H2, and a stacked film S2 alternately including the plurality of electrode layers 6 and the plurality of insulating layers 14 alternately stacked is formed on the insulating film 12. Next, an insulating film 29 is formed in the slit H5 (FIG. 20). The insulating film 29 is, for example, a silicon oxide film.

In this manner, the semiconductor device according to the third embodiment will be manufactured (FIG. 20). FIG. 1 illustrates a portion of the semiconductor device illustrated in FIG. 20. The semiconductor device according to the third embodiment can also curb degradation of reliability of the memory cell similarly to the first embodiment.

Figure 19:
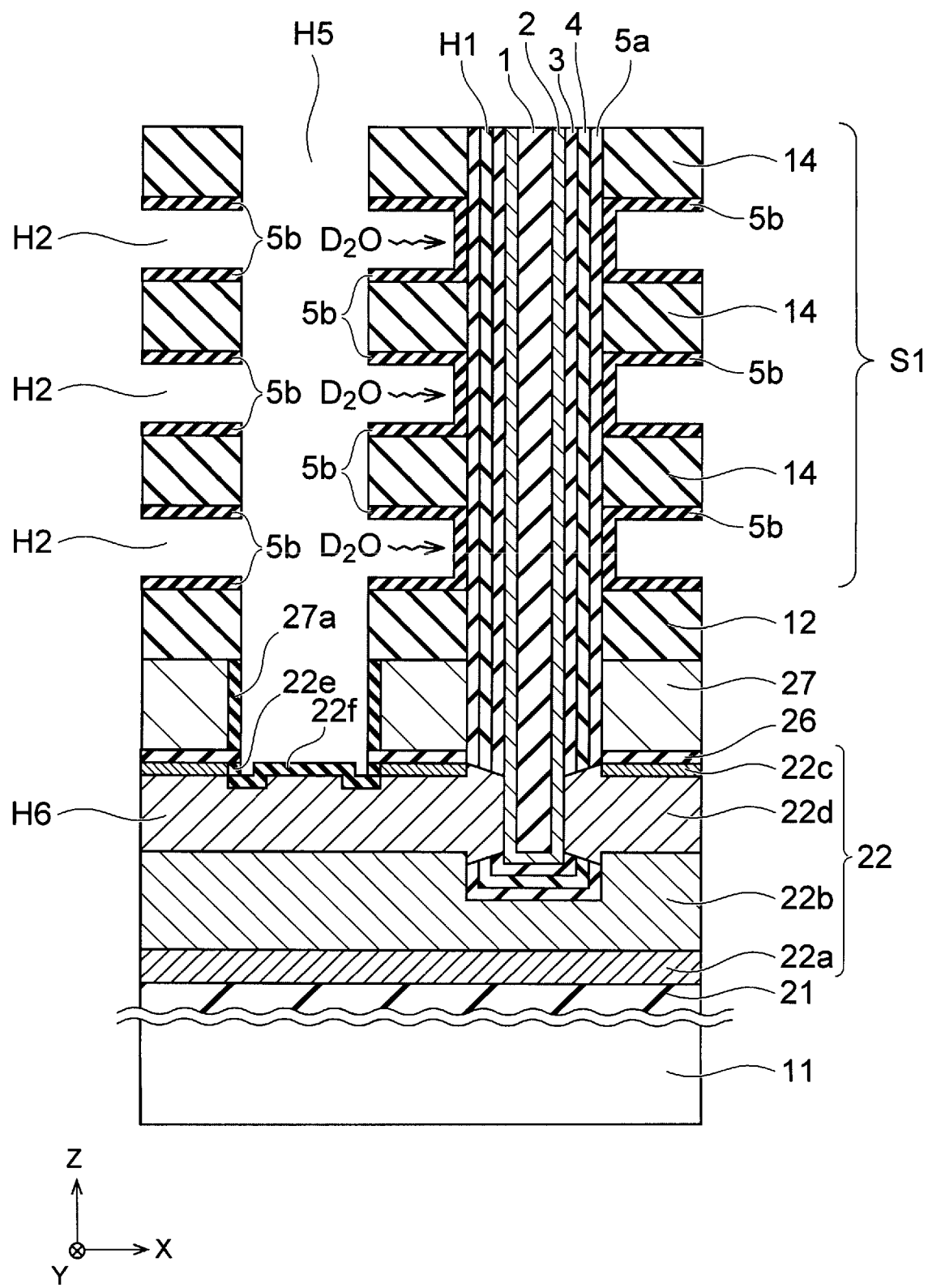
FIG. 19 is a sectional view illustrating the method for manufacturing the semiconductor device according to the third embodiment.

Also, in the third embodiment, the heat treatment described in the second embodiment, that is, heat treatment in which heat treatment illustrated in FIGS. 9 and 10 is repeated may be performed instead of the heat treatment of introducing deuterium (D) illustrated in FIG. 19. in this case, it is possible to reduce the impurity concentration in the charge storage film 4 and to curb degradation of reliability of the memory cell similarly to the second embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor device comprising:
a stacked body having insulating layers and conductive layers alternately stacked along a first direction;
a semiconductor layer disposed along the first direction in the stacked body;
a first insulating film disposed along the first direction between the stacked body and the semiconductor layer;
a second insulating film disposed along the first direction between the stacked body and the first insulating film;
a third insulating film disposed along the first direction between the stacked body and the second insulating film; and a fourth insulating film having: (i) a first portion disposed between one of the conductive layers and the third insulating film, and (ii) a second portion disposed along a second direction that intersects the first direction and between one of the conductive layers and one of the insulating layers, the second portion being connected to the first portion, wherein the first insulating film, the second insulating film, the third insulating film, and the fourth insulating film comprise deuterium, the second insulating film has a greater concentration of deuterium than the first insulating film, the first insulating film has a greater concentration of deuterium than the first portion, and the first portion has a greater concentration of deuterium than the third insulating film.

2. The semiconductor device according to claim 1, further comprising:
a first interconnection disposed along the second direction,
wherein the semiconductor layer is electrically connected to the first interconnection.

3. The semiconductor device according to claim 2, further comprising:
a gate layer provided between the stacked body and the first interconnection, the gate layer comprising a semiconductor material.

4. The semiconductor device according to claim 1, wherein the second insulating film includes silicon nitride, the first insulating film includes silicon oxynitride, and the fourth insulating film includes aluminum oxide.

5. The semiconductor device according to claim 1, wherein the semiconductor device is a NAND memory device.

6. The semiconductor device according to claim 5, wherein the semiconductor device includes a memory cell array.

7. The semiconductor device according to claim 1, wherein the conductive layers include WORD lines.

8. The semiconductor device according to claim 1, wherein the first insulating film includes a tunnel insulating film.

9. The semiconductor device according to claim 8, wherein the tunnel insulating film is formed of silicon oxynitride.

10. The semiconductor device according to claim 1, wherein an interface between the second insulating film and the first insulating film has a greater concentration of deuterium than the first insulating film and a lower concentration of deuterium than the second insulating film.

11. The semiconductor device according to claim 1, wherein:
the third insulating film and the fourth insulating film further comprise chlorine, and
the third insulating film has a greater concentration of chlorine than the fourth insulating film.

12. The semiconductor device according to claim 11, wherein:
the second insulating film further comprises chlorine, and
the third insulating film has a greater concentration of chlorine than the second insulating film.

13. The semiconductor device according to claim 12, wherein:
the first insulating film further comprises chlorine, and
the first insulating film has a greater concentration of chlorine than the second insulating film.

14. The semiconductor device according to claim 1, wherein:
the semiconductor layer comprises deuterium, and
the first portion has a greater concentration of deuterium than the semiconductor layer.

15. The semiconductor device according to claim 1, wherein:
the second insulating film is a charge storage film.

* * * * *